United States Patent [19]
Lee et al.

[11] Patent Number: 5,292,681
[45] Date of Patent: Mar. 8, 1994

[54] METHOD OF PROCESSING A SEMICONDUCTOR WAFER TO FORM AN ARRAY OF NONVOLATILE MEMORY DEVICES EMPLOYING FLOATING GATE TRANSISTORS AND PERIPHERAL AREA HAVING CMOS TRANSISTORS

[75] Inventors: Roger R. Lee; Tyler A. Lowrey; Fernando Gonzalez; J. Dennis Keller, all of Boise, Id.

[73] Assignee: Micron Semiconductor, Inc., Boise, Id.

[21] Appl. No.: 123,611

[22] Filed: Sep. 16, 1993

[51] Int. Cl.⁵ .......................................... H01L 21/266
[52] U.S. Cl. ........................................ 437/48; 437/34; 437/43; 437/57
[58] Field of Search ............... 437/29, 34, 43, 48, 437/49, 51, 54, 56, 57, 58; 148/DIG. 109

[56] References Cited

U.S. PATENT DOCUMENTS

| | | | |
|---|---|---|---|
| 4,434,543 | 3/1984 | Schwabe et al. | 437/34 |
| 4,549,340 | 10/1985 | Nagasawa et al. | 437/43 |
| 4,851,361 | 7/1989 | Schumann et al. | 437/57 |
| 4,929,565 | 5/1990 | Parillo | 437/57 |
| 5,175,120 | 12/1992 | Lee | 437/48 |
| 5,188,976 | 2/1993 | Kume et al. | 437/43 |
| 5,223,451 | 6/1993 | Uemura et al. | 437/48 |

FOREIGN PATENT DOCUMENTS 60-138955  7/1985  Japan.

Primary Examiner—Brian E. Hearn
Assistant Examiner—Chandro Chaudhari
Attorney, Agent, or Firm—Wells, St. John, Roberts, Gregory & Matkin

[57] ABSTRACT

Disclosed is fabricating a semiconductor wafer to form a memory array and peripheral area, the array comprising nonvolatile memory devices employing floating gate transistors and the peripheral area comprising CMOS transistors. A first layer of conductive material is applied atop insulating layers. A dielectric layer is applied atop the first conductive layer for use in floating gate transistors within the array. The dielectric layer and first conductive material are etched from the peripheral area, leaving patterned dielectric material and first conductive material in the array. A second layer of conductive material is applied atop the wafer to cover the peripheral area and dielectric layer of the array. The conductive and dielectric materials of the array are patterned and etched separately from the patterning and etching of conductive material of each of the first and second conductivity type CMOS transistors of the peripheral area. As well, the conductive material of the first conductivity type CMOS transistors of the peripheral area are patterned and etched separately from the patterning and etching of each of, a) conductive and dielectric materials of the array, and b) conductive material of the second conductivity type CMOS transistors of the peripheral area. Further, the conductive material of the second conductivity type CMOS transistors of the peripheral area are patterned and etched separately from patterning and etching of each of, a) conductive and dielectric materials of the array, and b) conductive material of the first conductivity type CMOS transistors of the peripheral area.

28 Claims, 23 Drawing Sheets

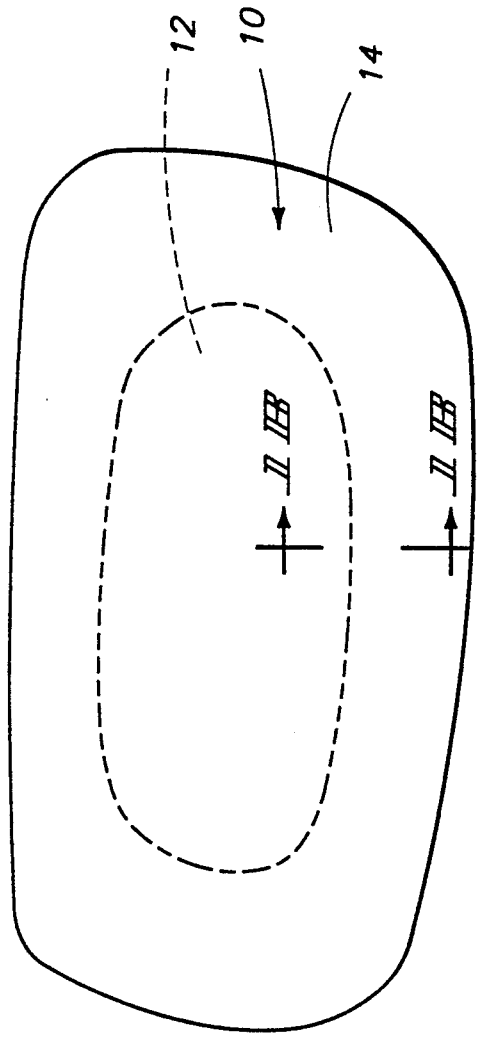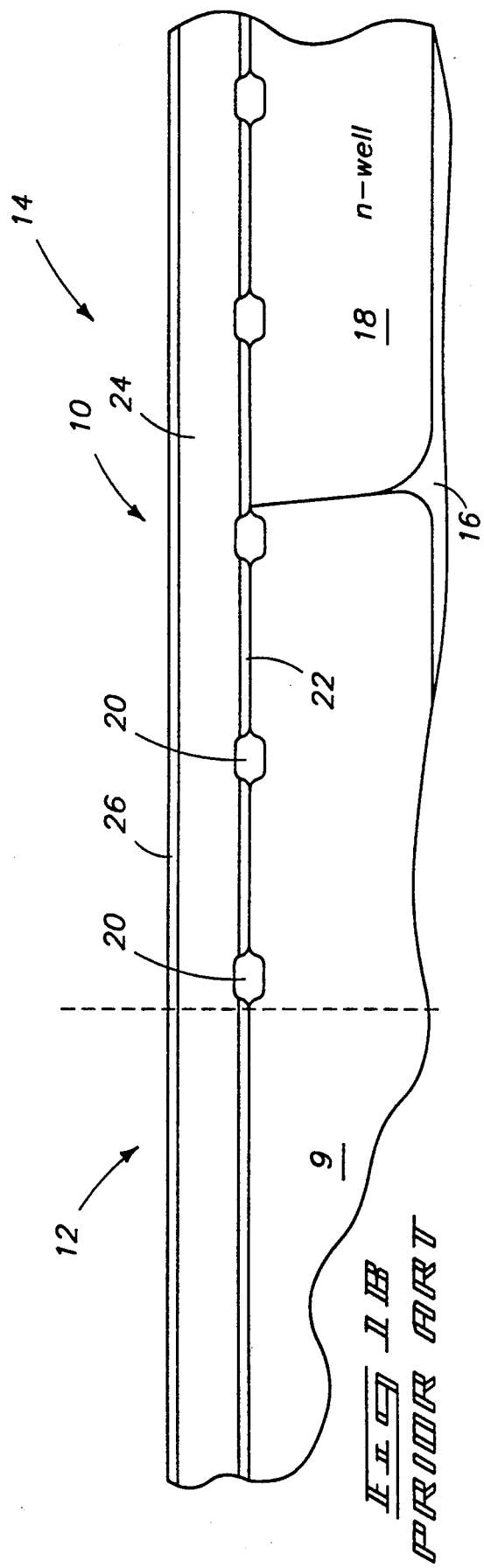
FIG. 1A PRIOR ART
FIG. 1B PRIOR ART

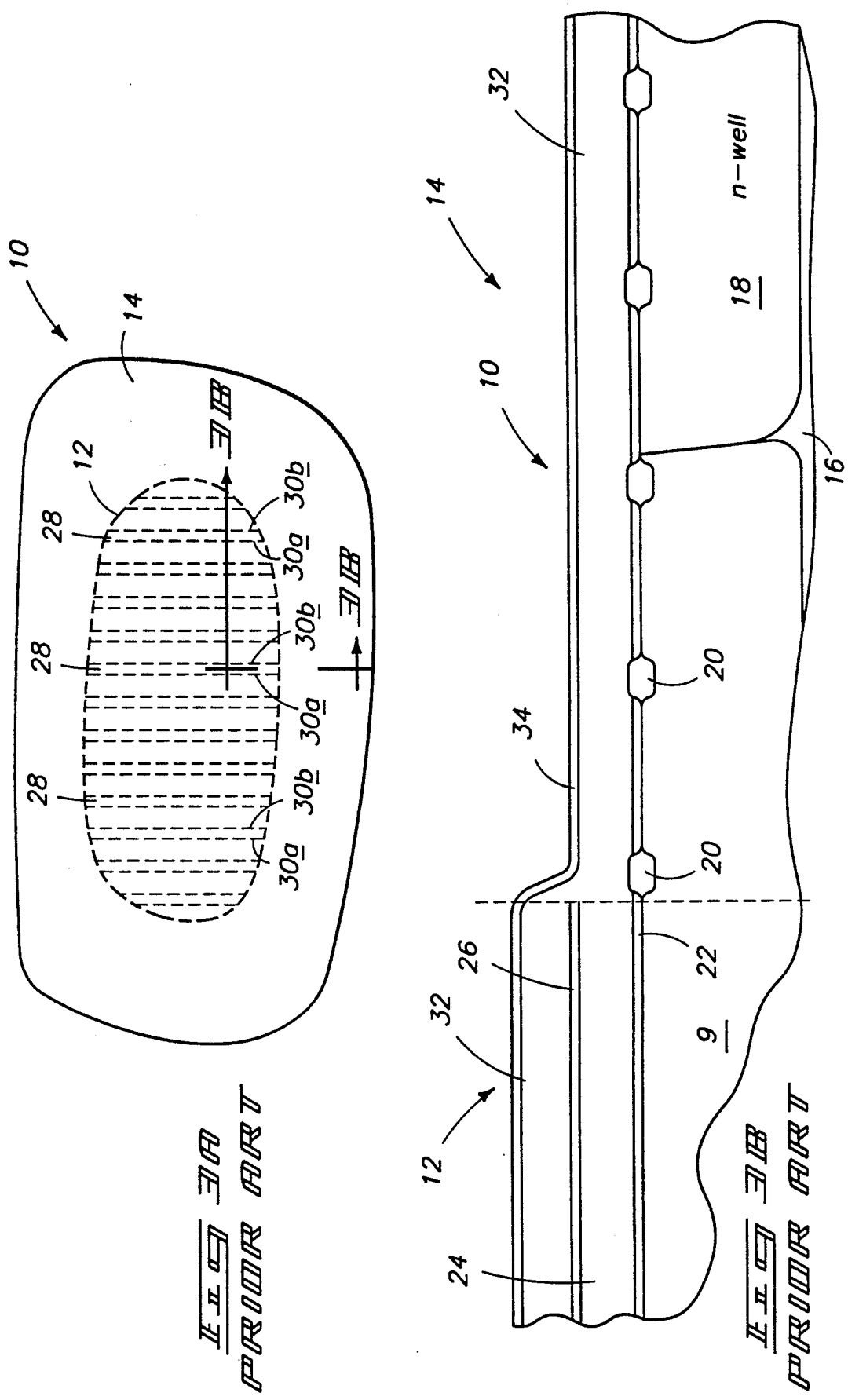

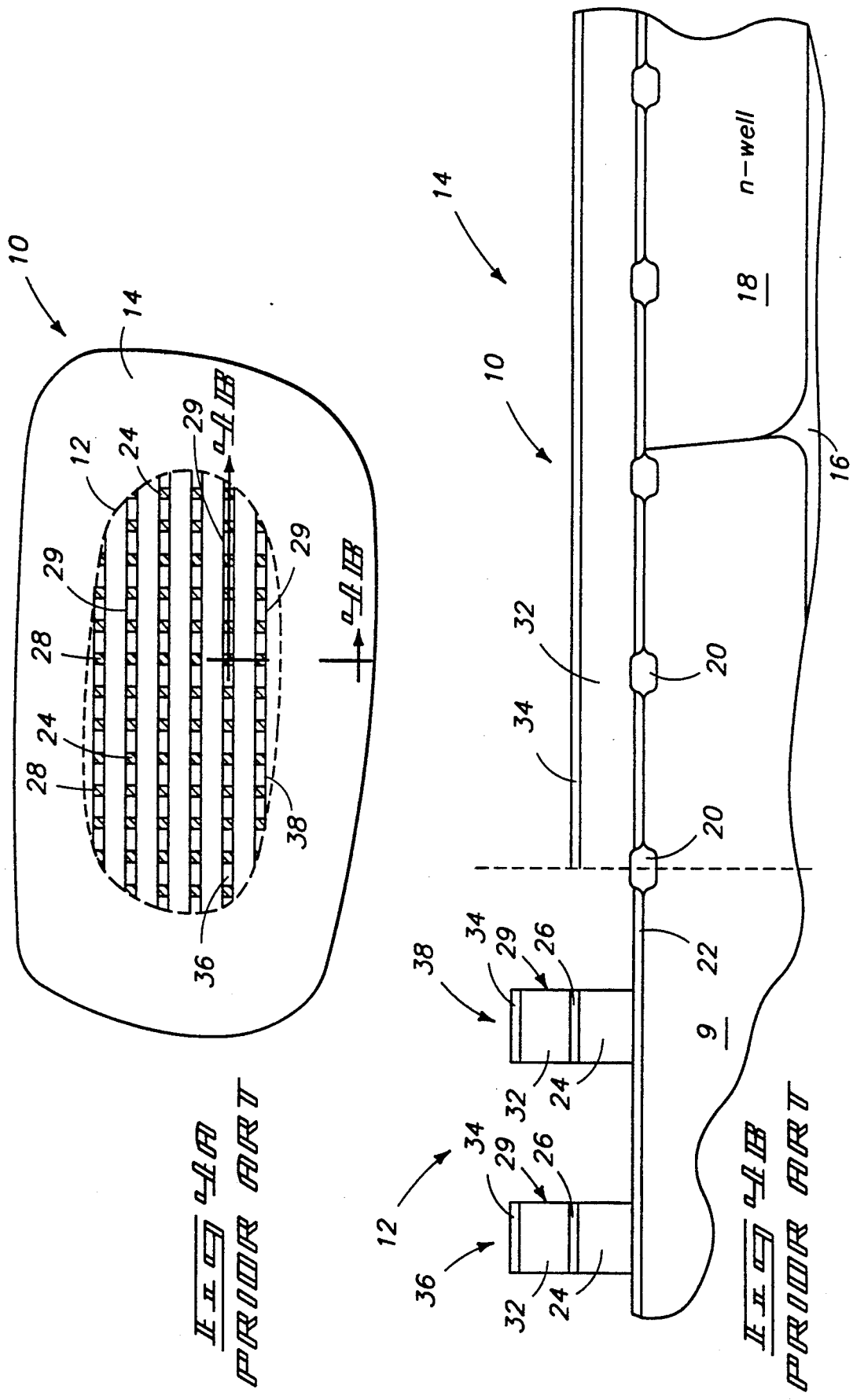

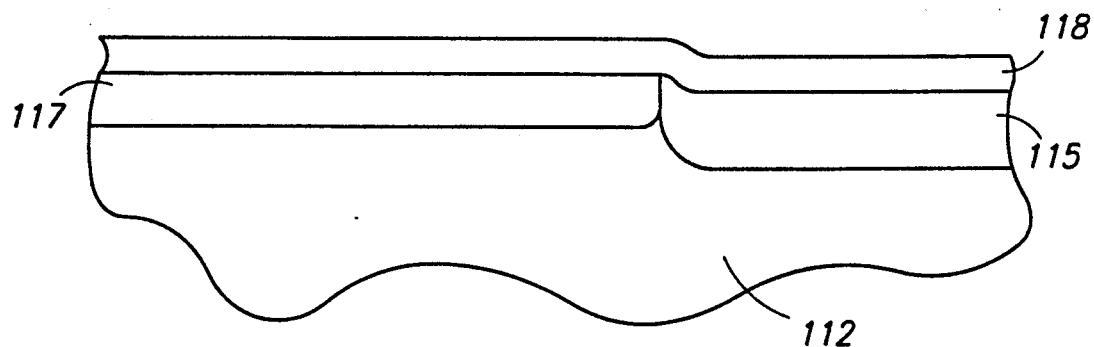
_Fig 13_
PRIOR ART
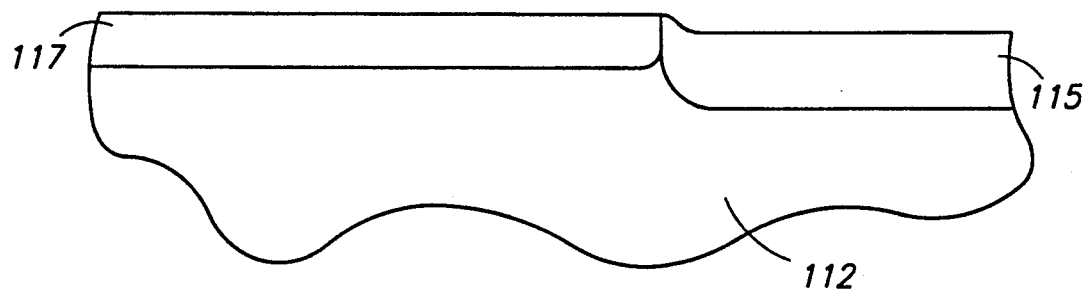
_Fig 14_
PRIOR ART

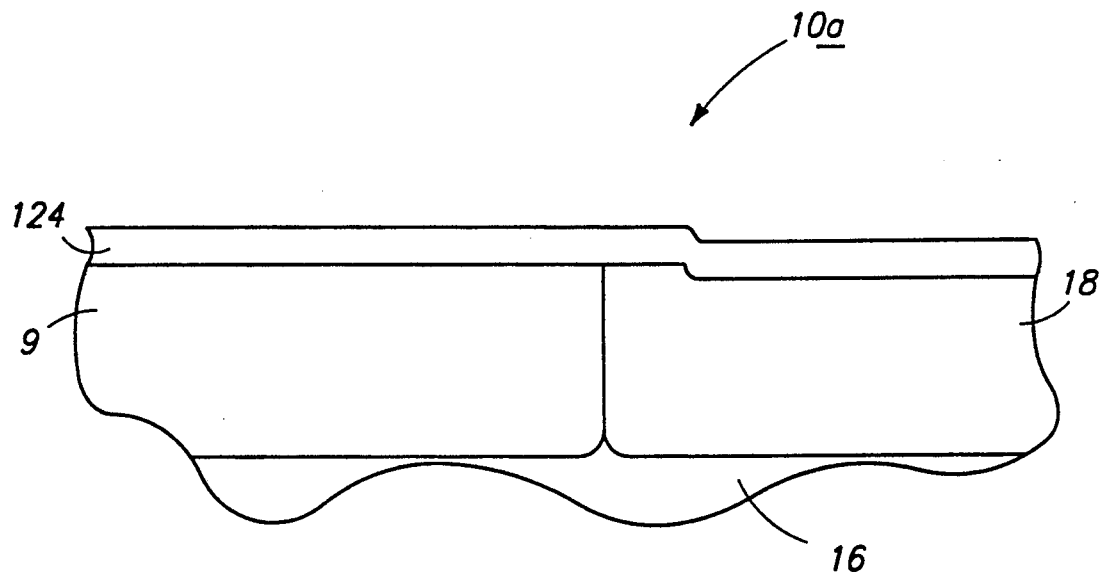
_Fig 19_
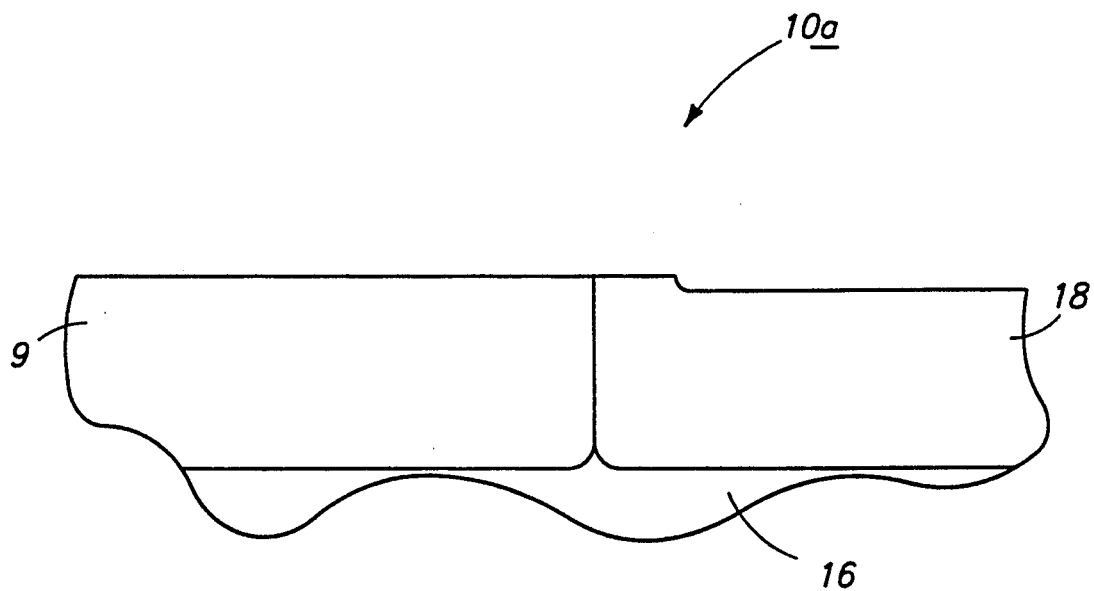
_Fig 20_

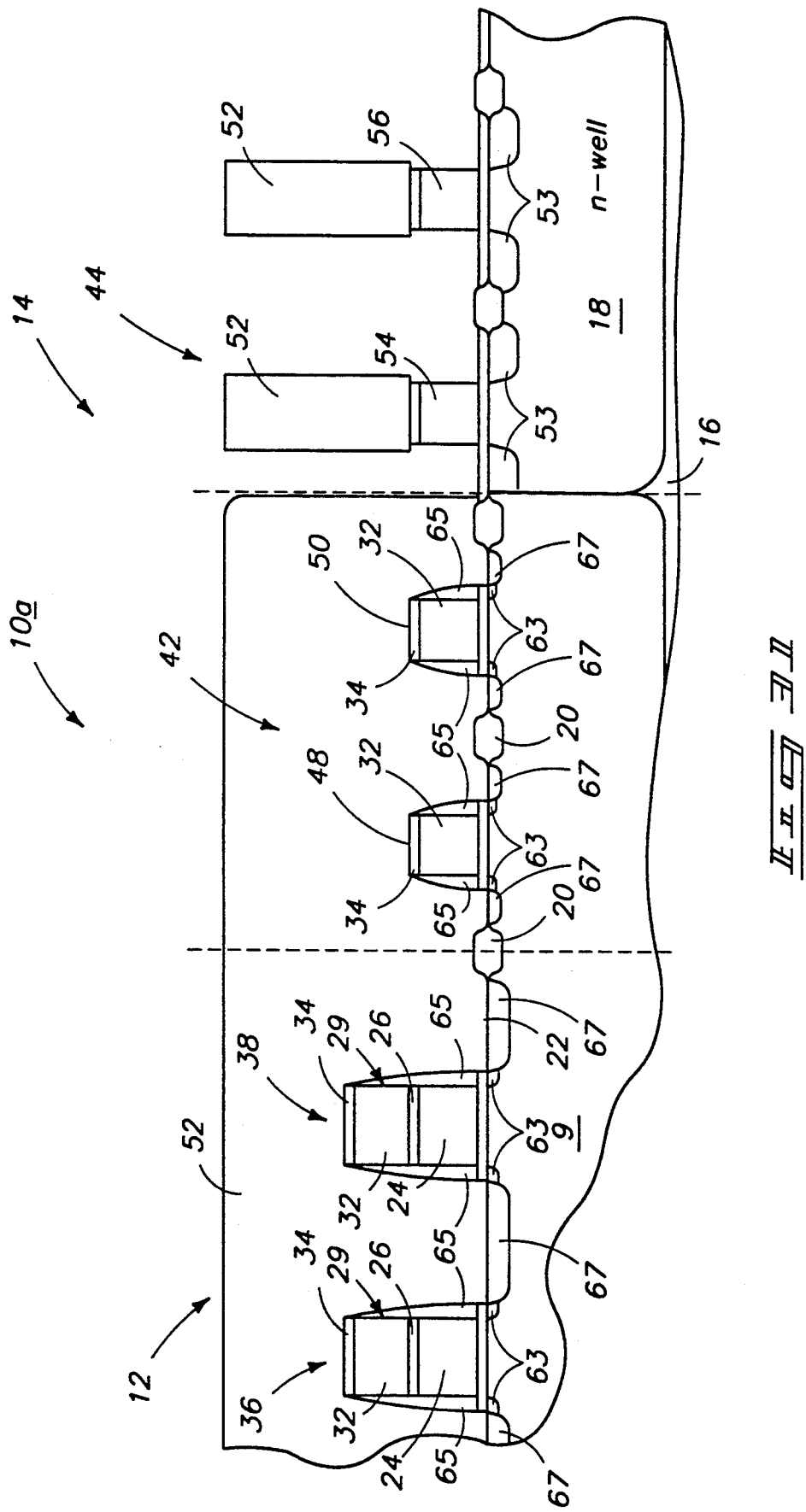

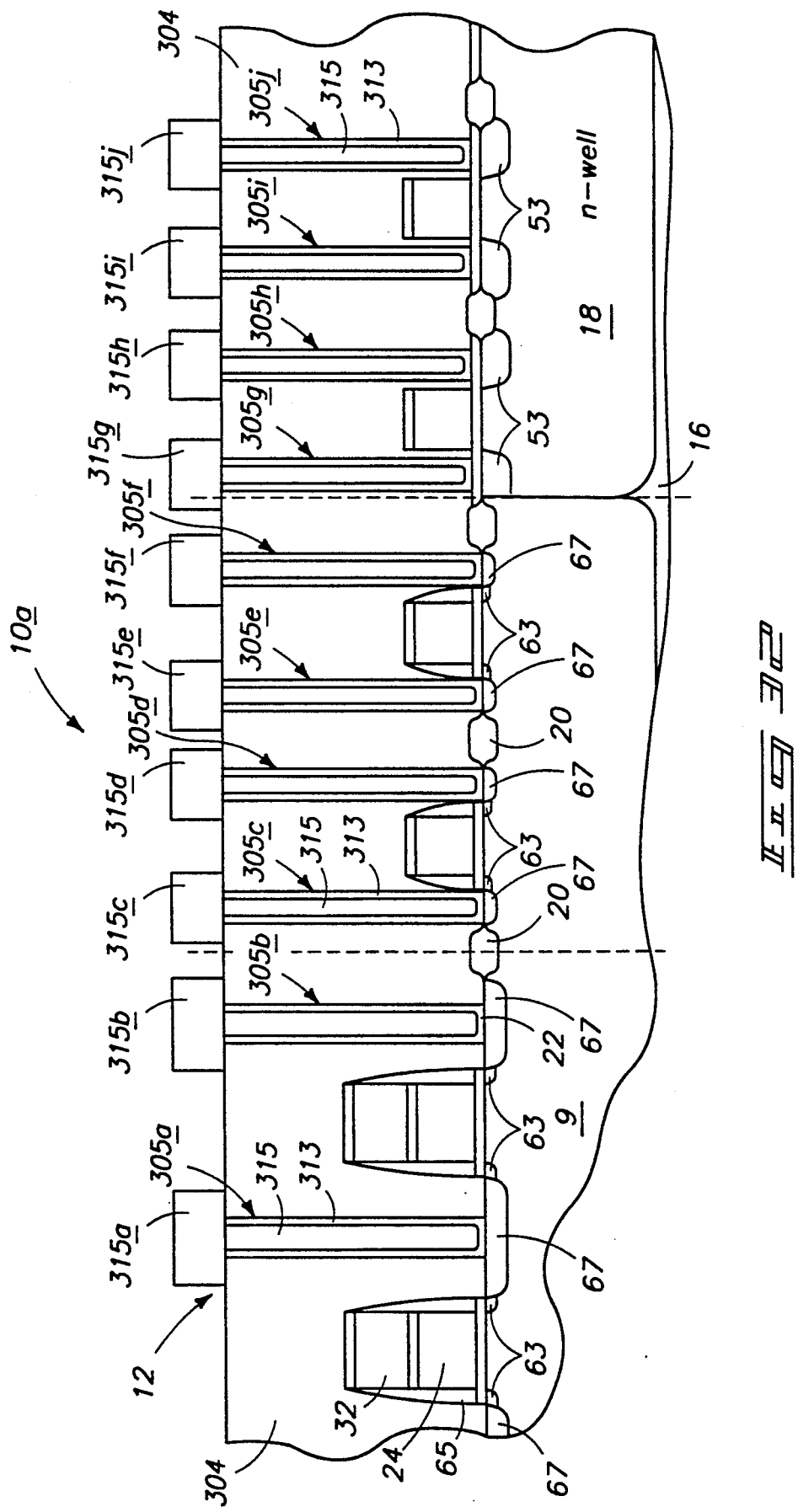

METHOD OF PROCESSING A SEMICONDUCTOR WAFER TO FORM AN ARRAY OF NONVOLATILE MEMORY DEVICES EMPLOYING FLOATING GATE TRANSISTORS AND PERIPHERAL AREA HAVING CMOS TRANSISTORS

TECHNICAL FIELD

This invention relates generally to fabrication of semiconductor wafers to form memory arrays and areas peripheral to the array, with the arrays comprising non-volatile memory devices employing floating gate transistors. More particularly, the invention concerns fabrication of EPROM and EEPROM memory arrays.

BACKGROUND OF THE INVENTION

Read-only-memories (ROMs) are memories into which information is permanently stored during fabrication. Such memories are considered "non-volatile" as only read operations can be performed.

Each bit of information in a ROM is stored by the presence or absence of a data path from the word (access) line to a bit (sense) line. The data path is eliminated simply by insuring no circuit element joins a word and bit line. Thus, when the word line of a ROM is activated, the presence of a signal on the bit line will mean that a 1 is stored, whereas the absence of a signal indicates that a 0 is stored.

If only a small number of ROM circuits are needed for a specific application, custom mask fabrication might be too expensive or time consuming. In such cases, it would be faster and cheaper for users to program each ROM chip individually. ROMs with such capabilities are referred to as programmable read-only-memories (PROMs). In the first PROMs which were developed, information could only be programmed once into the construction and then could not be erased. In such PROMs, a data path exists between every word and bit line at the completion of the chip manufacture. This corresponds to a stored 1 in every data position. Storage cells during fabrication were selectively altered to store a 0 following manufacture by electrically severing the word-to-bit connection paths. Since the write operation was destructive, once the 0 had been programmed into a bit location it could not be erased back to a 1. PROMs were initially implemented in bipolar technology, although MOS PROMs became available.

Later work with PROMs led to development of erasable PROMs. Erasable PROMs depend on the long-term retention of electric charge as the means for information storage. Such charge is stored on a MOS device referred to as a floating polysilicon gate. Such a construction differs slightly from a conventional MOS transistor gate. The conventional MOS transistor gate of a memory cell employs a continuous polysilicon word line connected among several MOS transistors which functions as the respective transistor gates. The floating polysilicon gate of an erasable PROM interposes a localized secondary polysilicon gate in between the continuous word line and silicon substrate into which the active areas of the MOS transistors are formed. The floating gate is localized in that the floating gates for respective MOS transistors are electrically isolated from the floating gates of other MOS transistors.

Various mechanisms have been implemented to transfer and remove charge from a floating gate. One type of erasable programmable memory is the so-called electrically programmable ROM (EPROM). The charge-transfer mechanism occurs by the injection of electrons into the floating polysilicon gate of selected transistors. If a sufficiently high reverse-bias voltage is applied to the transistor drain being programmed, the drain-substrate "pn" junction will experience "avalanche" breakdown, causing hot electrons to be generated. Some of these will have enough energy to pass over the insulating oxide material surrounding each floating gate and thereby charge the floating gate. These EPROM devices are thus called floating-gate, avalanche-injection MOS transistors (FAMOS). Once these electrons are transferred to the floating gate, they are trapped there. The potential-barrier at the oxide-silicon interface of the gate is greater than 3 eV, making the rate of spontaneous emission of the electrons from the oxide over the barrier negligibly small. Accordingly, the electronic charge stored on the floating gate can be retained for many years.

When the floating gate is charged with a sufficient number of electrons, inversion of the channel under the gate occurs. A continuously conducting channel is thereby formed between the source and drain exactly as if an external gate voltage had been applied. The presence of a 1 or 0 in each bit location is therefore determined by the presence or absence of a conducting floating channel gate in each program device.

Such a construction also enables means for removing the stored electrons from the floating gate, thereby making the PROM erasable. This is accomplished by flood exposure of the EPROM with strong ultraviolet light for approximately 20 minutes. The ultraviolet light creates electron-hole pairs in the silicon dioxide, providing a discharge path for the charge (electrons) from the floating gates.

In some applications, it is desirable to erase the contents of a ROM electrically, rather than to use an ultraviolet light source. In other circumstances, it would be desirable to be able to change one bit at a time, without having to erase the entire integrated circuit. Such led to the development of electrically erasable PROMs (EEPROMs). Such technologies include MNOS transistors, floating-gate tunnel oxide MOS transistors (FLOTOX), textured high-polysilicon floating-gate MOS transistors, and flash EEPROMs. Such technologies can include a combination of floating gate transistor memory cells within an array of such cells, and a peripheral area to the array which comprises CMOS transistors.

With floating gate transistors, the floating gate polysilicon (commonly referred to as Poly 1) is positioned in between the overlying word line polysilicon (commonly referred to as Poly 2) and underlying substrate. Two edges of the floating gate poly are lined up directly relative to the word line edge. This factor would make the photo and etch process very difficult if one were to try to completely define the floating gate poly first, and then pattern the word line. This would be due to the problems of photomask misalignment and photo-edge etch effect.

One approach of avoiding the problem is to first define only two edges (instead of all four edges) of the floating gate. The typical two edges patterned first are the Poly 1 floating gate edges which do not coincide with the word line edges. With this completed, a stack poly etch for the word lines during the Poly 2 etch (word line) patterning defines the word line edges as well as the remaining two edges of the floating gate. This approach is not sensitive to any misalignment due to the fact that the word line and corresponding floating gate edges "self-align" relative to each other during the same etching process.

Prior art techniques of processing erasable PROMs are described with reference to FIGS. 1A–5. FIG. 1A is a top view of a wafer fragment at one processing step, with FIG. 1B being an enlarged cross section taken through line 1B—1B of FIG. 1 during the same step. In each of the figures which follow, the "A" figure represents a top view, while the "B" view represents an enlarged cross sectional view at the same step in the described process. FIGS. 1A and 1B illustrate a wafer fragment 10 which will be defined by a memory array area 12 and an area 14 peripheral to array area 12. Wafer fragment 10 is comprised of a bulk substrate 16, which in the described embodiment is p-type, with peripheral area 14 being provided with n-well 18 for formation of CMOS transistors in the peripheral area 14 and p-well 9 in the peripheral and array area. Field oxide regions 20 and a gate insulating layer 22 are provided atop substrate 16. A first layer 24 of polysilicon (Poly 1) is applied atop insulating layers 20 and 22. A tri-layer 26 of dielectric is applied atop first polysilicon layer 24 for use in floating gate transistors to be formed within array area 12. Tri-layer 26 typically comprises an O-N-O sandwich construction.

Referring to FIGS. 2A and 2B, dielectric layer 26 and polysilicon layer 24 are etched away from peripheral area 14, and etched within array 12 to define lines 28. Lines 28 are defined by opposing edges 30a and 30b which will form the first two edges of the floating gate transistors within array 12, as will be apparent from the continuing discussion.

Referring to FIGS. 3A and 3B, a second polysilicon layer 32 is applied atop the wafer to cover peripheral area 14 and array area 12. As well, a thin higher conductive layer 34, such as WSi$_x$, is applied atop poly layer 32. Collectively, layers 32 and 34 are considered as the Poly 2 layer.

Referring to FIGS. 4A and 4B, a layer of photoresist (not shown) is applied and patterned as illustrated to define FAMOS transistor gates 36, 38 within array area 12, and coincident word lines 29 as shown. It is necessary that peripheral area 14 be masked with photoresist during such etch to prevent trenching into the wells of substrate 16.

Referring to FIG. 5, prior art processes next pattern peripheral area 14 to form each of the word line transistor gates 35, 37, 39 and 41 in the same step. (Word lines 35, 37, 39 and 41 are not shown in the "A" figures.) Thereafter, separate photoresist masks must be applied and patterned to enable implanting of the various p and n type dopant materials required adjacent illustrated transistor gates 36, 38, 35, 37, 39 and 41. Spacers as well are formed to produce the configuration shown in FIG. 6. The prior art process from FIG. 5 to produce the construction of FIG. 6 proceeds as follows.

Photoresist is applied and patterned to mask the n-well. A punch-through boron (p-type material) implant is then conducted (typical dose of $5 \times 10^{12}$ atoms/cm$^2$) into each of the unmasked n-channel transistor regions of the array and peripheral area. A conformal layer of oxide, such as TEOS, of approximately 1000 Angstroms thickness is applied atop the wafer. Photoresist is then again applied and patterned to mask the n-well. Phosphorus (n-type material) is then implanted (typical dose of $5 \times 10^{13}$ atoms/cm$^2$) to form LDD regions 11. The photoresist is then removed, and oxide layer is applied and anisotropically etched to form spacers 13. Photoresist is then reapplied and patterned to mask the n-well. Arsenic (n-type material) is then implanted (typical dose of $5 \times 10^{15}$ atoms/cm$^2$) to form n+ source and drain regions 15. The photoresist is then removed, and then reapplied and patterned to mask everything but the n-well. Boron (p-type material) is then implanted (typical dose of $5 \times 10^{15}$ atoms/cm$^2$) to form source and drain p+ regions 17, and then the photo resist removed.

Such results in high process complexity and numerous photomasks which increase the cost and time to process the wafers. For example from FIG. 3, six photomasks are required by the above process to effect all the desired implants. At least one more photomask would be required were it desirable to optimize or modify the n-channel implants of the array transistors differently from the peripheral n-channel transistors. It would be desirable to improve upon this prior art method.

Further, the above process typically begins with the creation of N-wells and P-wells in a silicon substrate. FIGS. 7–15 illustrate the conventional N-well and P-well formation process.

Referring to FIG. 7, a pad oxide layer 111 is thermally grown on a lightly-doped P-type silicon wafer substrate 112.

Referring to FIG. 8, a silicon nitride layer 113 is deposited on top of pad oxide layer 111.

Referring to FIG. 9, future P-well regions on the substrate are masked with a photoresist layer 114.

Referring to FIG. 10, the wafer is subjected to a nitride etch, which removes those portions of silicon nitride layer 113 that are not subjacent photoresist layer 114. These regions where the nitride is removed correspond to the future N-well regions. A phosphorus implant then creates N-well regions 115, with only one such region being shown in FIG. 10.

Referring to FIG. 11, following a photoresist strip, a silicon oxide masking layer 116 is grown in the N-well regions 115 during a steam oxidization step. It will be noted that the steam well oxidation recesses only the N-well regions 115. The pattern of recessed N-well regions on the wafer is commonly used for the alignment of subsequent photomasks. During the steam oxidization step, the phosphorus atoms in the N-well regions 115 diffuse somewhat deeper into the substrate 112 and under the uplifted edges of nitride layer 113.

Referring to FIG. 12, the wafer is subjected to a boron implant which creates P-well regions 117, with only one such region being shown in FIG. 12. The silicon oxide masking layer 116 prevents the penetration of boron atoms into the N-well regions 115. It will be noted that both the phosphorus implant depicted in FIG. 10 and the boron implant depicted in FIG. 12 were made through pad oxide layer 11. Implanting through an oxide layer tends to partially deflect implanted atoms, and thus eliminates the channeling tendency that occurs when an implant is made directly into a monocrystalline silicon layer. Channeling is the propensity of a high-energy particle to travel through a silicon crystal lattice if it enters the lattice such that it travels between layers of regularly oriented silicon atoms. Small particles, such as boron atoms, are more prone to channeling than larger articles. Because of the more diverse arrangement of molecules in a silicon oxide layer, the layer will tend to deflect implanted particles in a random manner, thus allowing only a small percentage of the particles to engage in channeling.

Referring to FIG. 13, pad oxide layer 111 and masking oxide layer 116 have been removed with a first oxide etch, and a high-temperature drive step has caused the phosphorus atoms in N-well region 115 and the boron atoms in P-well region 117 to diffuse, thereby increasing the depth of each region. During the drive step, a thermal oxide layer 118 is typically grown on top of the N-well region 115 and the P-well region 117.

Referring now to FIG. 14, a second oxide etch has removed thermal oxide layer 118.

Referring to FIG. 15, a pad oxide layer 119 has been grown on both N-well regions 115 and P-wells regions 117. Additional processing is then conducted to complete the desired circuitry.

The process described immediately above is extensively used in the semiconductor industry for creating N and P-wells. The process does have a drawback in the high number of process steps involved.

Aspects of the following disclosed and claimed invention are related to our issued U.S. Pat. No. 5,175,120.

BRIEF DESCRIPTION OF THE DRAWINGS

Preferred embodiments of the invention are described below with reference to the accompanying drawings.

FIG. 1A is a top plan view of a semiconductor wafer fragment processed in accordance with prior art methods, and is described in the "Background" section above.

FIG. 1B is an enlarged cross sectional view of FIG. 1A taken through line 1B—1B in FIG. 1A.

FIG. 3A is a top plan view of the FIG. 1A wafer fragment at a processing step subsequent to that illustrated by FIGS. 2A and 2B.

FIG. 3B is an enlarged cross sectional view of FIG. 3A taken through line 3B—3B in FIG. 3A.

FIG. 4A is a top plan view of the FIG. 1A wafer fragment at a processing step subsequent to that illustrated by FIG. 3A.

FIG. 4B is an enlarged cross sectional view taken through line 4B—4B in FIG. 4A.

FIG. 13 is a cross sectional view of the FIG. 7 wafer taken at a processing step subsequent to that illustrated by FIG. 12.

FIG. 14 is a cross sectional view of the FIG. 7 wafer taken at a processing step subsequent to that illustrated by FIG. 13.

FIG. 19 is a cross sectional view of the FIG. 16 wafer at a processing step subsequent to that illustrated by FIG. 18.

FIG. 20 is a cross sectional view of the FIG. 16 wafer at a processing step subsequent to that illustrated by FIG. 19.

FIG. 31 is a cross sectional view of the FIG. 25 wafer at a processing step subsequent to that illustrated by FIG. 30.

FIG. 32 is a cross sectional view of the FIG. 25 wafer at a processing step subsequent to that illustrated by FIG. 31.

DETAILED DESCRIPTION OF THE PREFERRED EMBODIMENTS

Figures 2A, 2B:
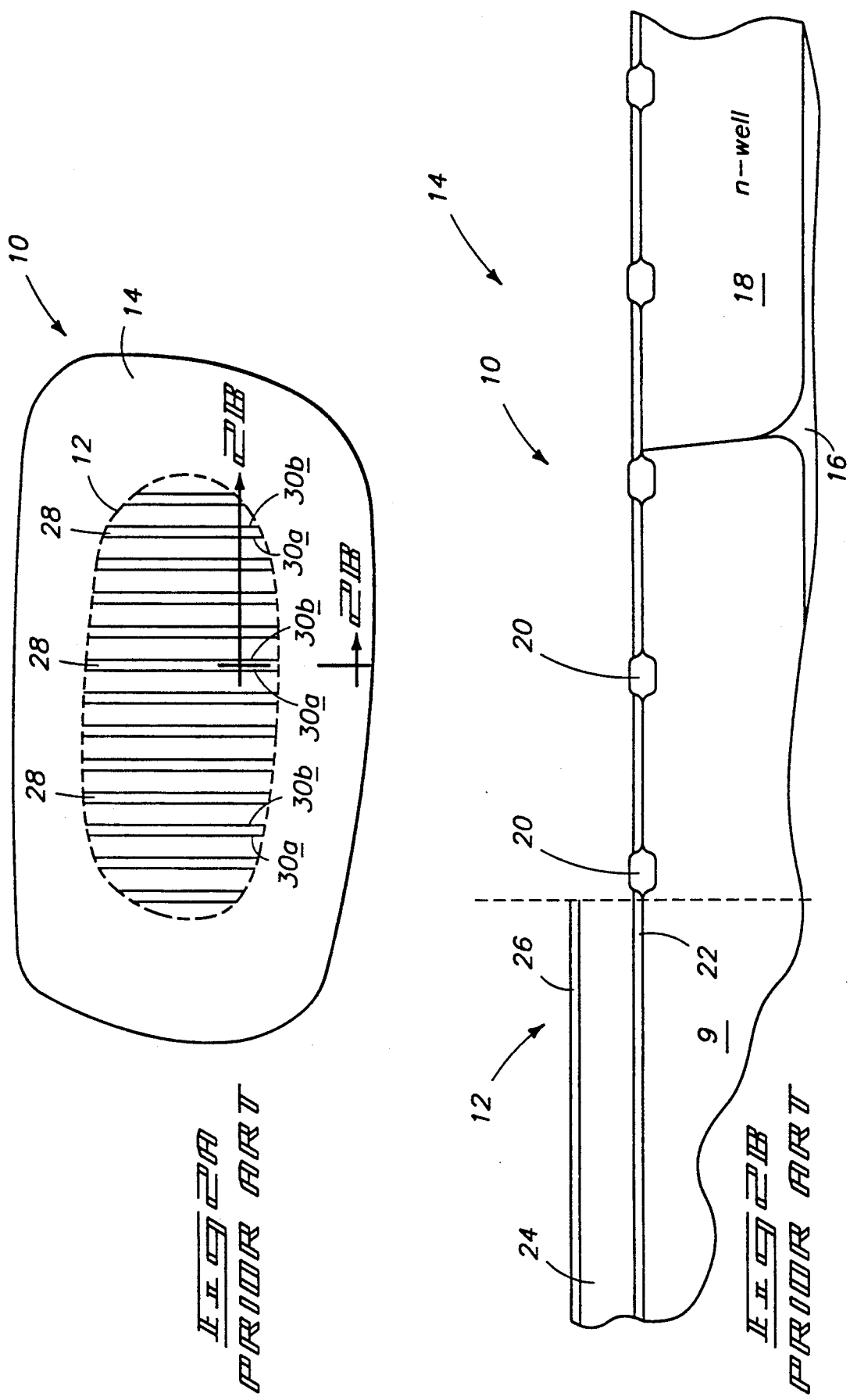
FIG. 2A is a top plan view of the FIG. 1A wafer fragment at a processing step subsequent to that illustrated by FIGS. 1A and 1B.
FIG. 2B is an enlarged cross sectional view of FIG. 2A taken through line 2B—2B of FIG. 2A.
Figure 5:
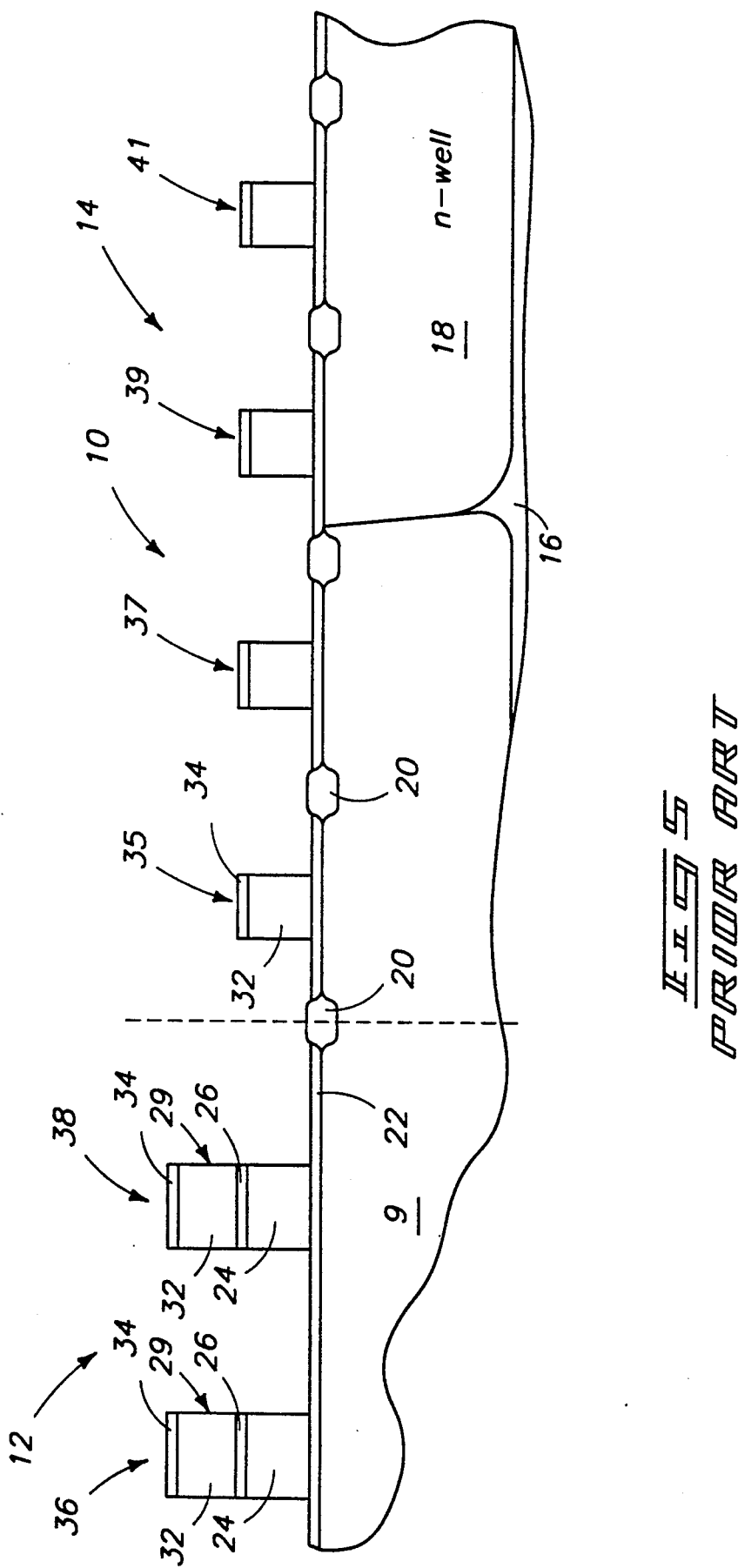
FIG. 5 is a cross sectional view of the FIG. 1A wafer corresponding in position to that of FIG. 1B, but taken at a processing step subsequent to that illustrated by FIG. 4B.
Figure 6:
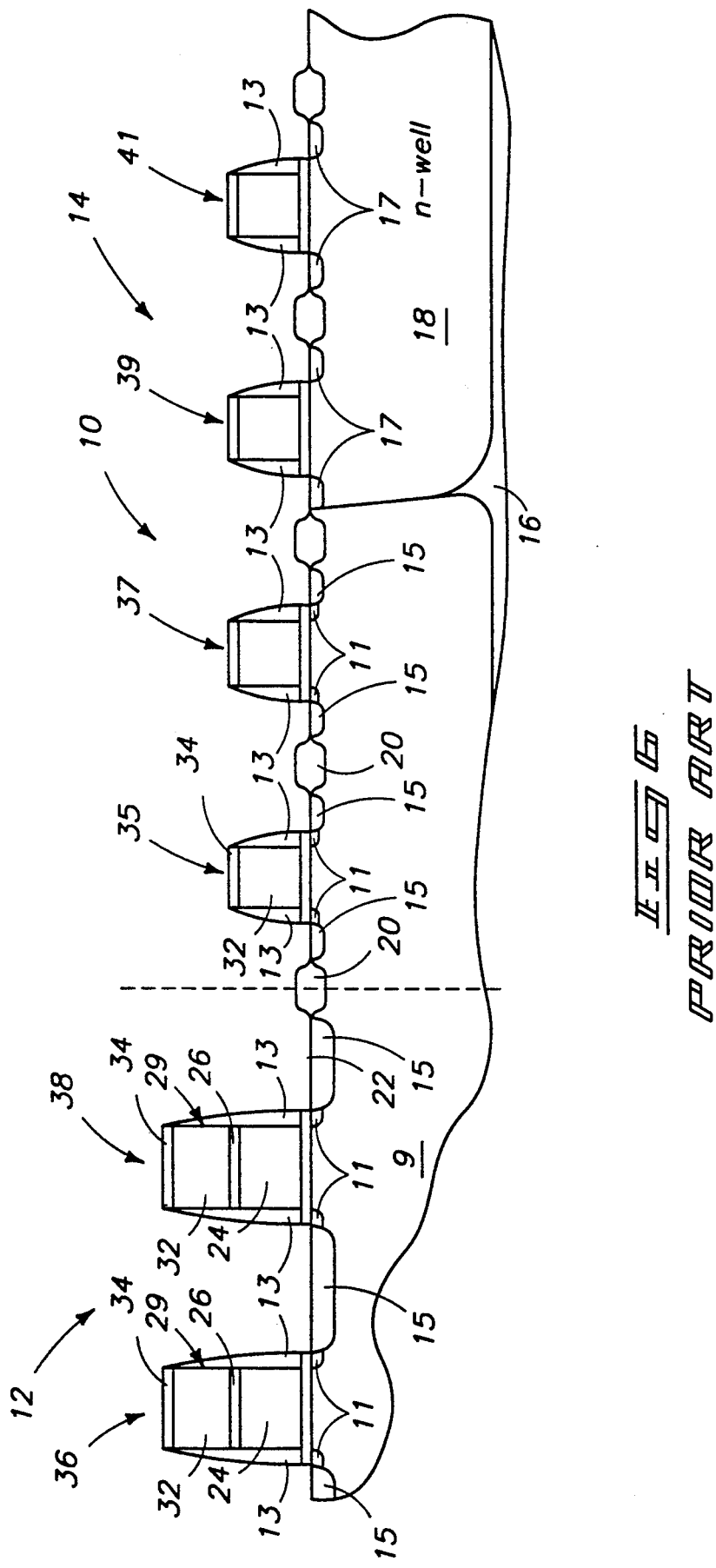
FIG. 6 is a cross sectional view of the FIG. 1A wafer corresponding in position to that of FIG. 1B, but taken at a processing step subsequent to that illustrated by FIG. 5B.
Figure 7:
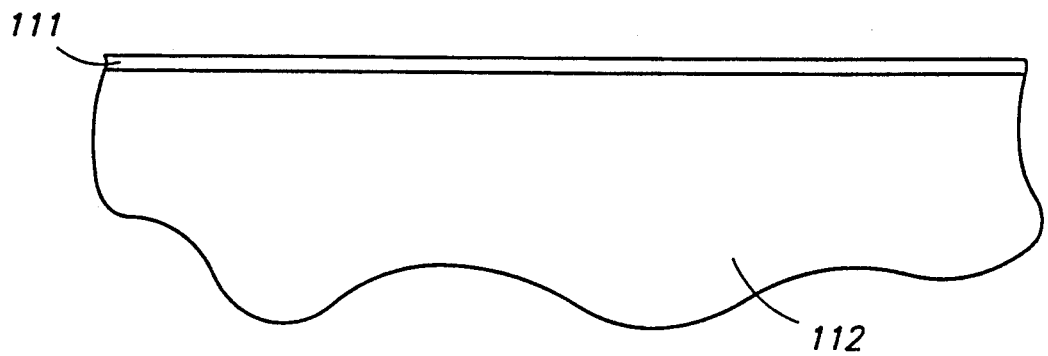
FIG. 7 is a cross sectional view of an alternate semiconductor wafer fragment processed in accordance with prior art methods, and is described in the "Background" section above.
Figure 8:
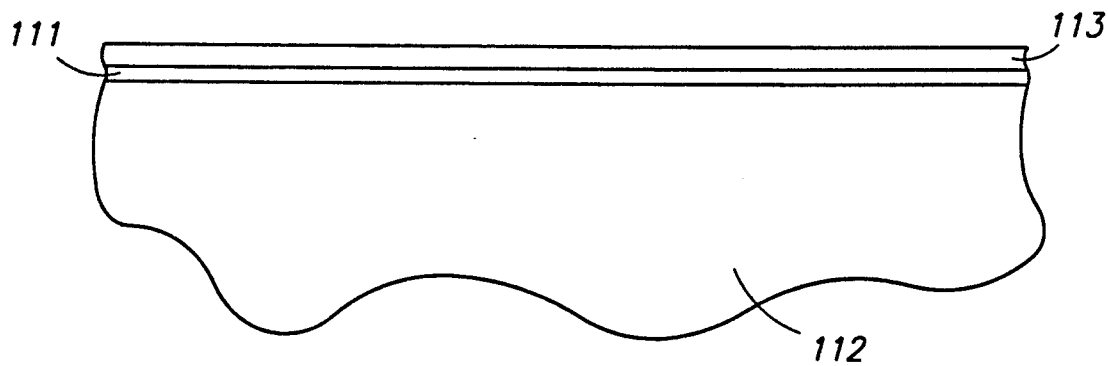
FIG. 8 is a cross sectional view of the FIG. 7 wafer taken at a processing step subsequent to that illustrated by FIG. 7.
Figure 9:
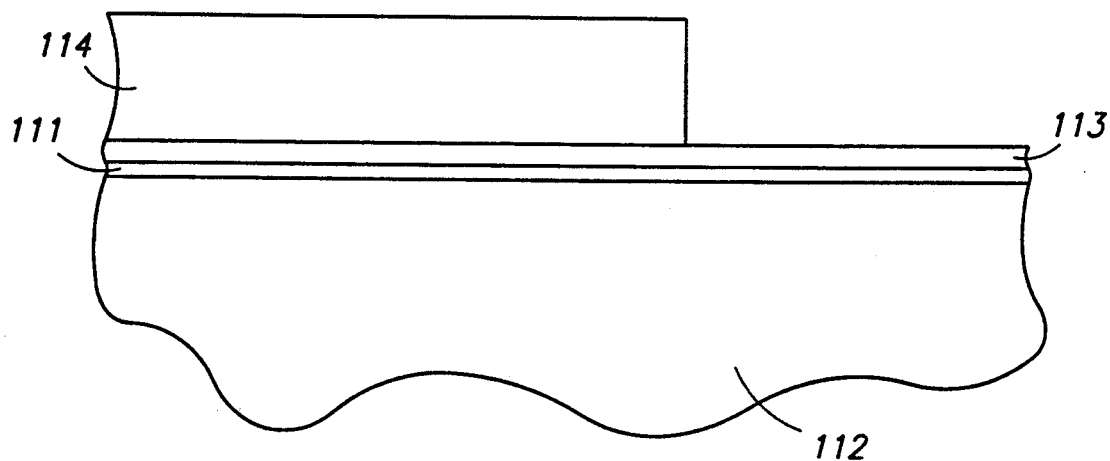
FIG. 9 is a cross sectional view of the FIG. 7 wafer taken at a processing step subsequent to that illustrated by FIG. 8.
Figure 10:
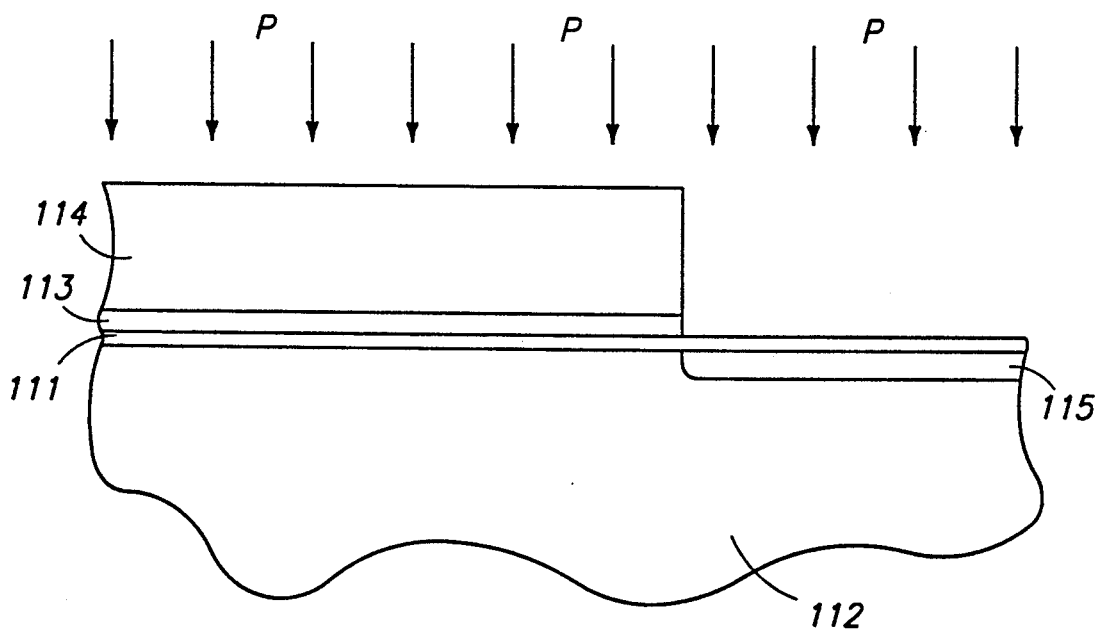
FIG. 10 is a cross sectional view of the FIG. 7 wafer taken at a processing step subsequent to that illustrated by FIG. 9.
Figure 11:
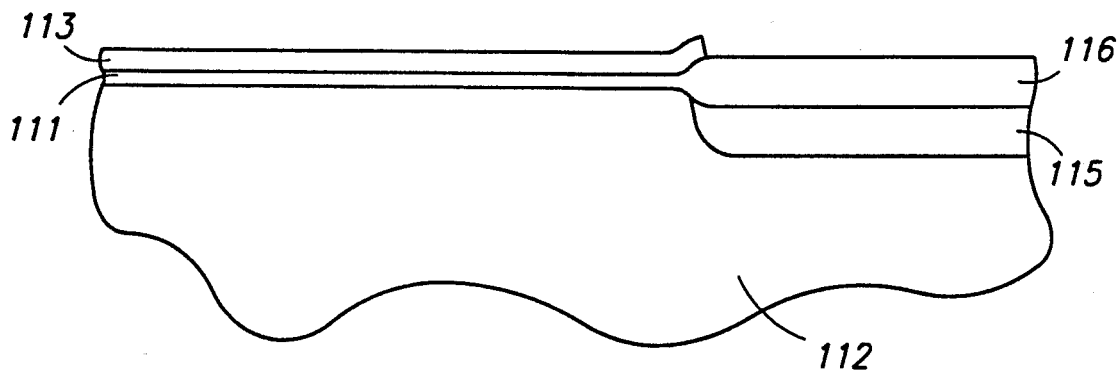
FIG. 11 is a cross sectional view of the FIG. 7 wafer taken at a processing step subsequent to that illustrated by FIG. 10.
Figure 12:
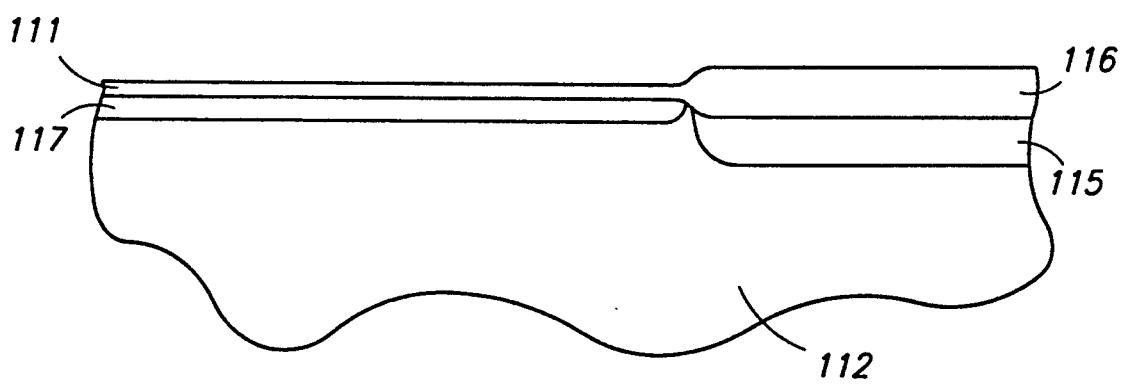
FIG. 12 is a cross sectional view of the FIG. 7 wafer taken at a processing step subsequent to that illustrated by FIG. 11.
Figure 15:
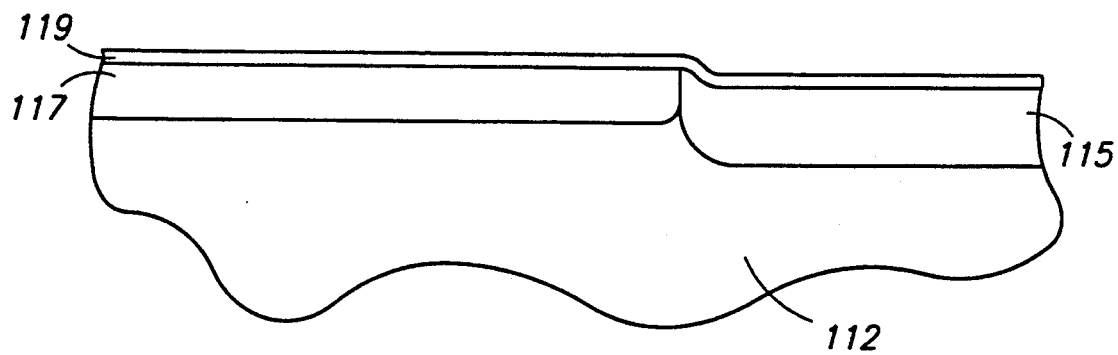
FIG. 15 is a cross sectional view of the FIG. 7 wafer taken at a processing step subsequent to that illustrated by FIG. 14.

This disclosure of the invention is submitted in furtherance of the constitutional purposes of the U.S. Patent Laws "to promote the progress of science and useful arts" (Article 1, Section 8).

In accordance with an aspect of the invention, a process for fabricating a semiconductor wafer to form a memory array and peripheral area, the array comprising nonvolatile memory devices employing floating gate transistors of a first conductivity type, the peripheral area comprising first and second conductivity type CMOS transistors, the method comprises the following steps:

providing field and gate insulating layers on a semiconductor wafer, and defining an array area and an area peripheral to the array area for formation of first conductivity type nonvolatile memory devices in the array and formation of first and second conductivity type CMOS transistors in the peripheral area, the peripheral area comprising first and second peripheral areas, the first and second conductivity type CMOS transistors to be formed in the first and second peripheral areas respectively, such providing and defining comprising N-well and P-well formation, such formation comprising: a) oxidizing the wafer to create a first silicon dioxide layer thereon; b) subjecting the wafer to a blanket P-well implant; c) masking future P-well regions with photoresist; d) etching away those portions of the first silicon dioxide layer that are not subjacent photoresist; e) recessing those portions of the substrate that are not subjacent photoresist; f) subjecting the wafer to an N-well implant; g) stripping photoresist; and h) subjecting the wafer to a high-temperature substrate drive step to drive atoms of the P-well implant and atoms of the N-well implant to diffuse deeper into the substrate;

providing a first layer of conductive material atop the insulating layers;

providing a dielectric layer atop the first conductive layer for use in floating gate transistors within the array;

etching the dielectric layer and first conductive material from the peripheral area, and leaving dielectric layer and first conductive material in the array;

after etching the dielectric layer and first conductive material from the peripheral area, providing a second layer of conductive material atop the wafer which covers the peripheral area and dielectric layer of the array;

patterning and etching the first conductive, second conductive and dielectric layers of the array and second conductive layer of the peripheral area to form gate regions of floating gate transistors in the array, and to cover the peripheral area;

patterning and etching the second conductive layer in the peripheral area to form transistor gates for the first conductivity type CMOS transistors in the first peripheral area, and to cover the second peripheral area;

after patterning and etching the array to form floating gate transistors and after patterning and etching the peripheral area to form transistor gates for the first conductivity type CMOS transistors, first doping exposed areas of only one of the array or first peripheral area while the second peripheral area and other of the array or first peripheral area are masked;

after the first doping, masking the second peripheral area with the second conductive layer without the use of photoresist and common doping exposed areas of the array and first peripheral area with first conductivity type material in the same step;

after patterning the array and first peripheral area, patterning and etching the second conductive layer in the second peripheral area to form transistor gates for the second conductivity type CMOS transistors in the second peripheral area; and after patterning and etching the second peripheral area, doping exposed areas of the second peripheral area with second conductivity type material while the array and first peripheral area are masked.

Figure 16:
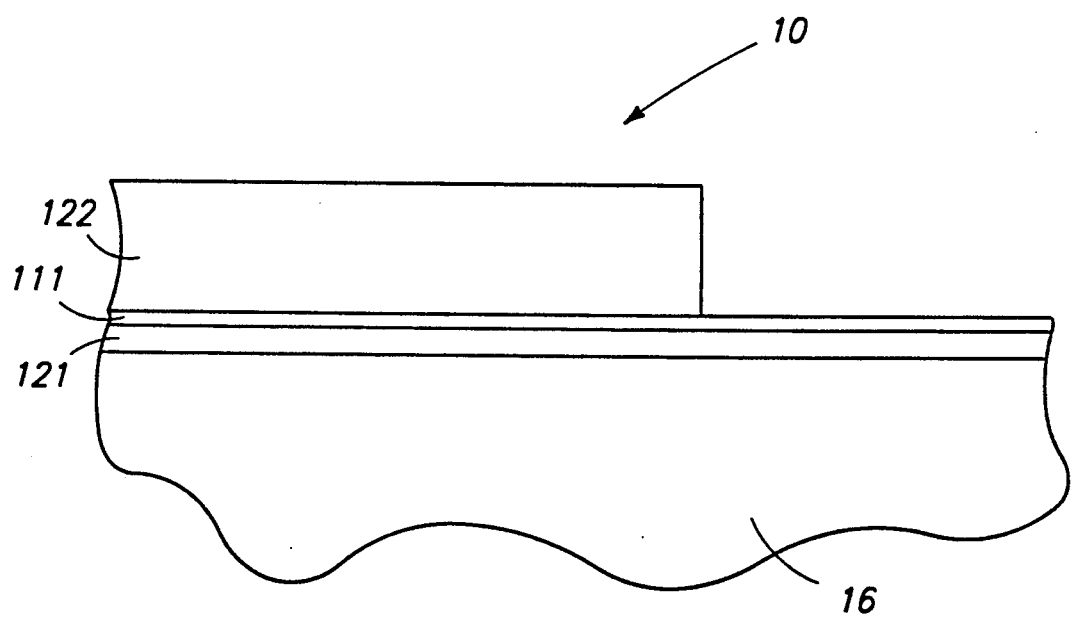
FIG. 16 is a cross sectional view of a semiconductor wafer processed in accordance with the invention.

The discussion of preferred embodiments proceeds with reference to FIGS. 16-32. First with reference to FIG. 16, an improved process for N-well and P-well creation on a silicon substrate 10a begins with thermal growth of a first silicon dioxide layer 111 on silicon substrate 16. In the conventional process, this thermal oxide layer serves as a pad oxide layer which decouples mechanical stresses. Such would otherwise be transmitted into the substrate 16 by a silicon nitride layer that is subsequently deposited and used as a mask during the steam oxidization. Hence, FIG. 16 is representative of a first step both of a conventional process and an improved process. Although silicon dioxide layer 111 is not used as a stress-relief layer in the improved process, its growth is the result of a thermal step which causes oxygen molecules trapped during silicon ingot formation to migrate to the surface. Expulsion of oxygen molecules from the surface, in what is often referred to as a denuding process, tends to reduce silicon defects which would otherwise reduce semiconductor efficiency in the completed circuit. For the improved process, layer 11 is referred to as the first silicon dioxide layer.

Still referring to FIG. 16, the oxide-coated substrate 16 is subjected to a blanket boron P-well implant, which creates a P-type region 121. Since boron is a relatively small atom, the first silicon dioxide layer 111 also reduces the channeling tendency of the boron atoms. Future P-well regions are masked with photoresist 122.

Figure 17:
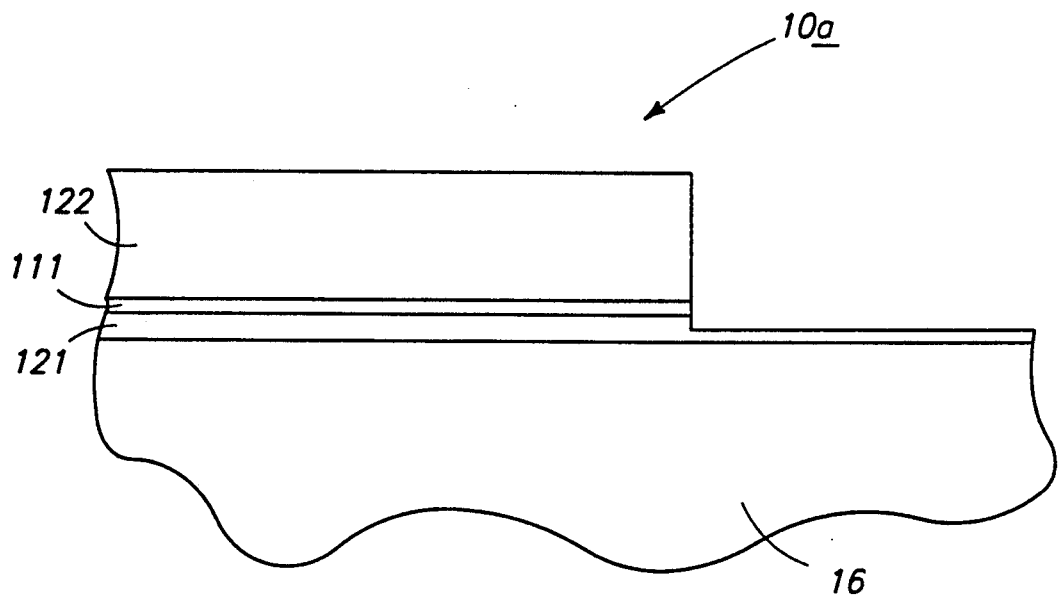
FIG. 17 is a cross sectional view of the FIG. 16 wafer at a processing step subsequent to that illustrated by FIG. 16.

Referring to FIG. 17, wafer 10a is subjected firstly to an oxide etch which removes portions of the first silicon dioxide layer 111, and then to a silicon etch which recesses portions of the substrate 16 that are not subjacent photoresist mask 22 approximately 1000 Angstroms below the original level. Although a two-step in-situ plasma etch is the preferred etch technique, either a two-step acid etch or a combination of a plasma etch and an acid etch may be used. The recessed substrate regions will become N-well regions, and the step between the recessed substrate regions and the raised P-well regions will be used to align subsequent masking steps. Recessing the future N-well regions also has the added advantage of removing a large portion of the boron atoms which were implanted during the blanket implant step referred to in FIG. 16.

Figure 18:
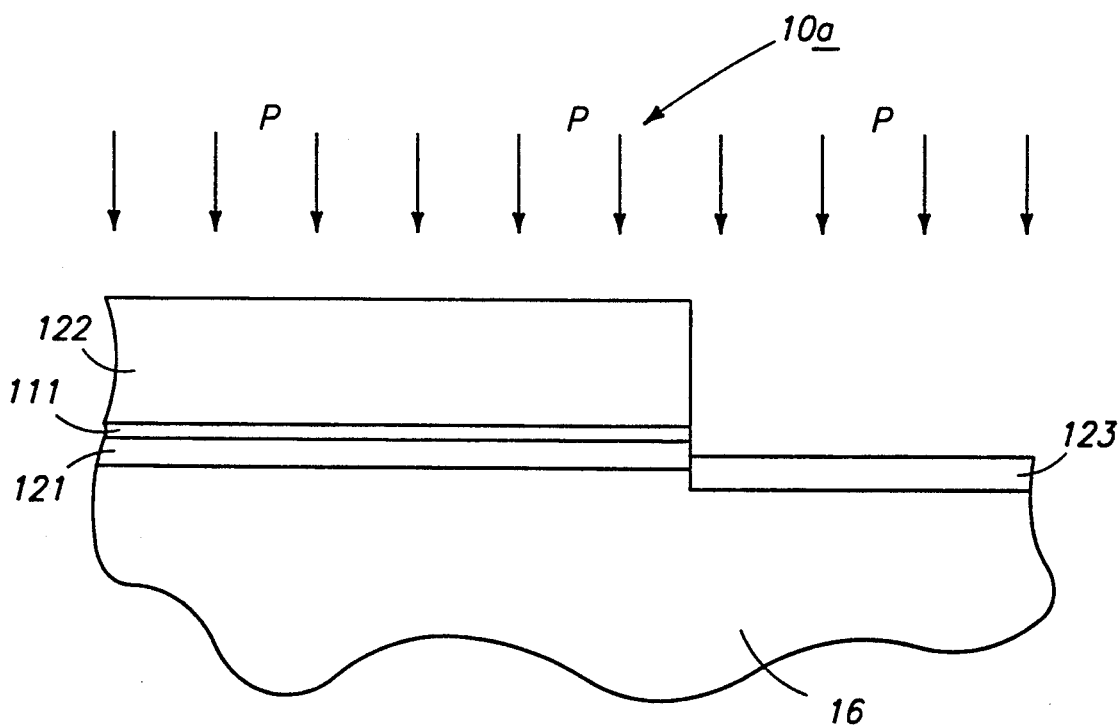
FIG. 18 is a cross sectional view of the FIG. 16 wafer at a processing step subsequent to that illustrated by FIG. 17.

Referring to FIG. 18, the wafer is subjected to a phosphorus N-well implant, which overwhelms any remaining boron atoms in the future N-well regions and creates an N-type layer 123 in the substrate where substrate 16 is not covered with photoresist mask 122. Since phosphorus is a relatively large atom, it is not very susceptible to channeling. Hence, the absence of the first silicon dioxide layer 111 in the future N-well regions during the phosphorus implant is insignificant.

Referring to FIG. 19, following the stripping of photoresist mask 122, the wafer is subjected to a high temperature drive step which causes the boron atoms in original P-layer 121 and the phosphorus atoms in original N-type layer 123 to diffuse deeper into the substrate, creating a N-well 9 and a P-well 18. The presence of oxygen during the drive step causes the thermal growth of an intermediate silicon dioxide layer 124. The growth of intermediate silicon dioxide layer 124 tends to heal any crystal defects on the surface of the silicon in the N-well regions that may have been created by the substrate recessing silicon etch described with reference to FIG. 17. Optionally, the high-temperature drive step may be performed principally in an anaerobic ambient, with oxygen being introduced during the drive step for a period sufficient to create a gate oxide layer of optimum thickness.

Referring to FIG. 20, thermal silicon dioxide layer 124 has been removed with a wet oxide etch.

Figure 21:
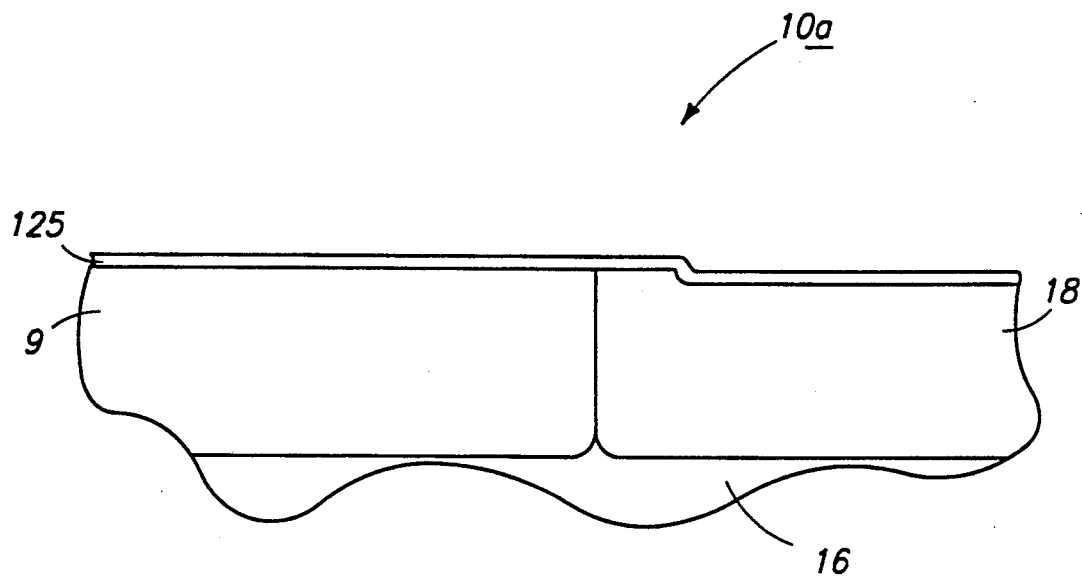
FIG. 21 is a cross sectional view of the FIG. 16 wafer at a processing step subsequent to that illustrated by FIG. 20.

Referring to FIG. 21, a pad oxide layer 125 is grown.

Figure 22:
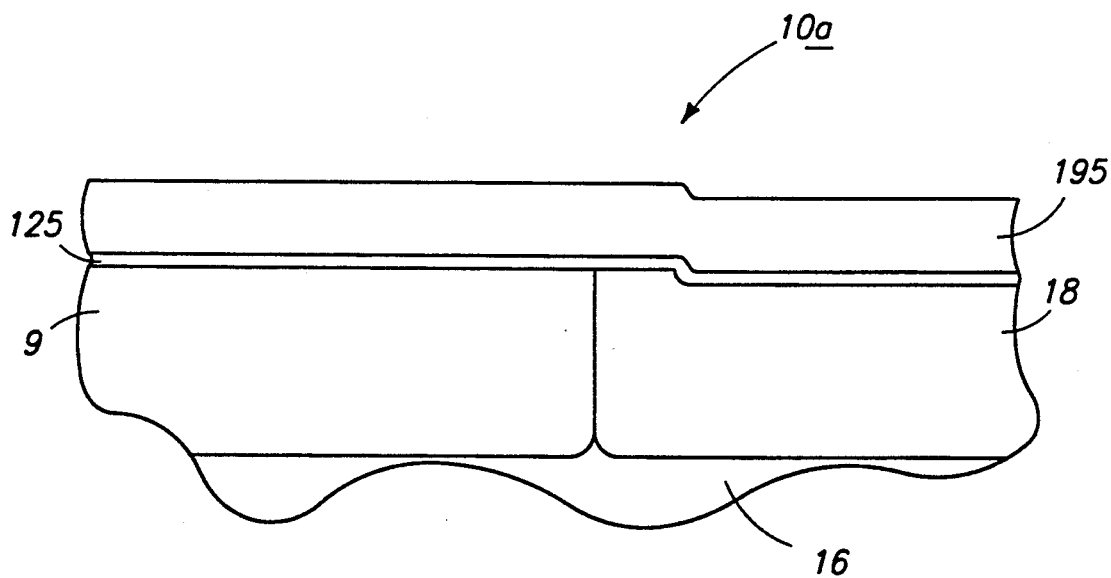
FIG. 22 is a cross sectional view of the FIG. 16 wafer at a processing step subsequent to that illustrated by FIG. 21.

Referring to FIG. 22, a layer 195 of nitride, such as $Si_3N_4$ is deposited.

Figure 23:
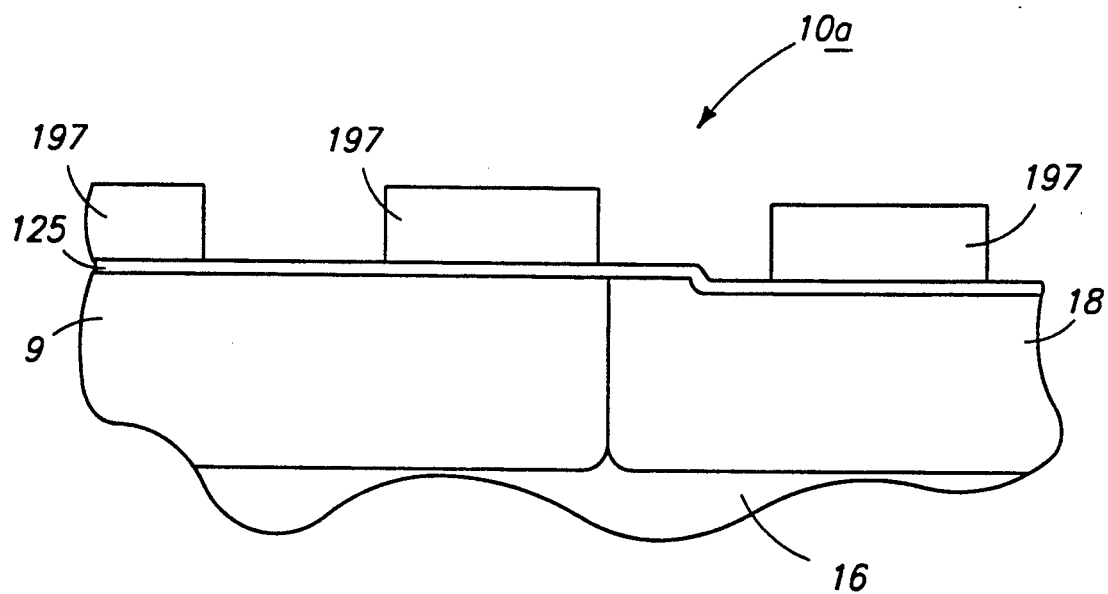
FIG. 23 is a cross sectional view of the FIG. 16 wafer at a processing step subsequent to that illustrated by FIG. 22.

Referring to FIG. 23, nitride layer 195 is patterned and etched to produce nitride masking blocks 197.

Figure 24:
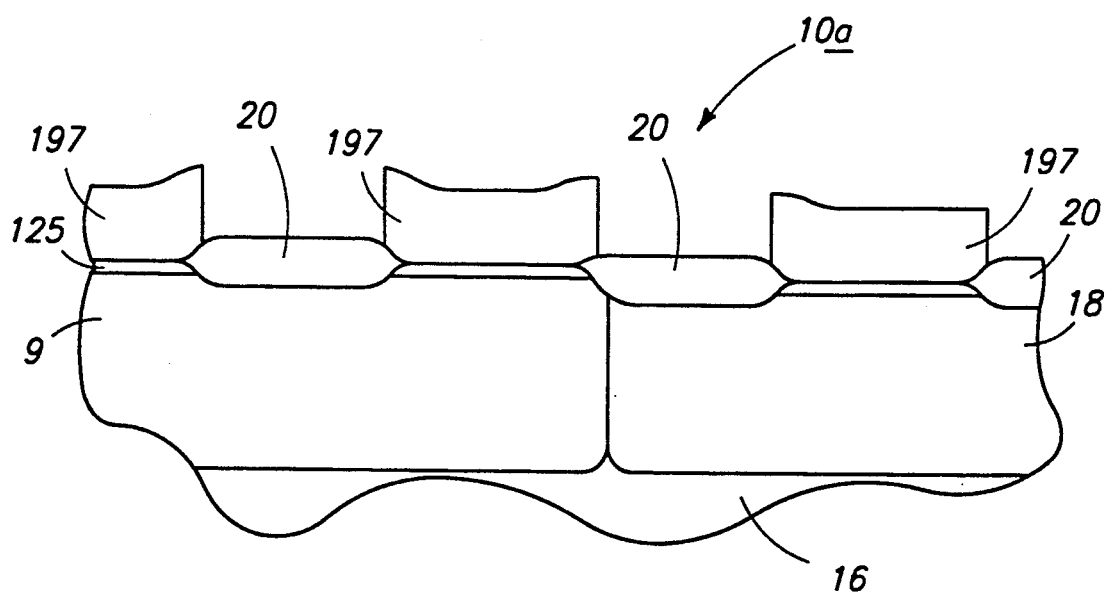
FIG. 24 is a cross sectional view of the FIG. 16 wafer at a processing step subsequent to that illustrated by FIG. 23.

Referring to FIG. 24, the wafer is subjected to LOCOS for creation of field oxide regions 20.

Figure 25:
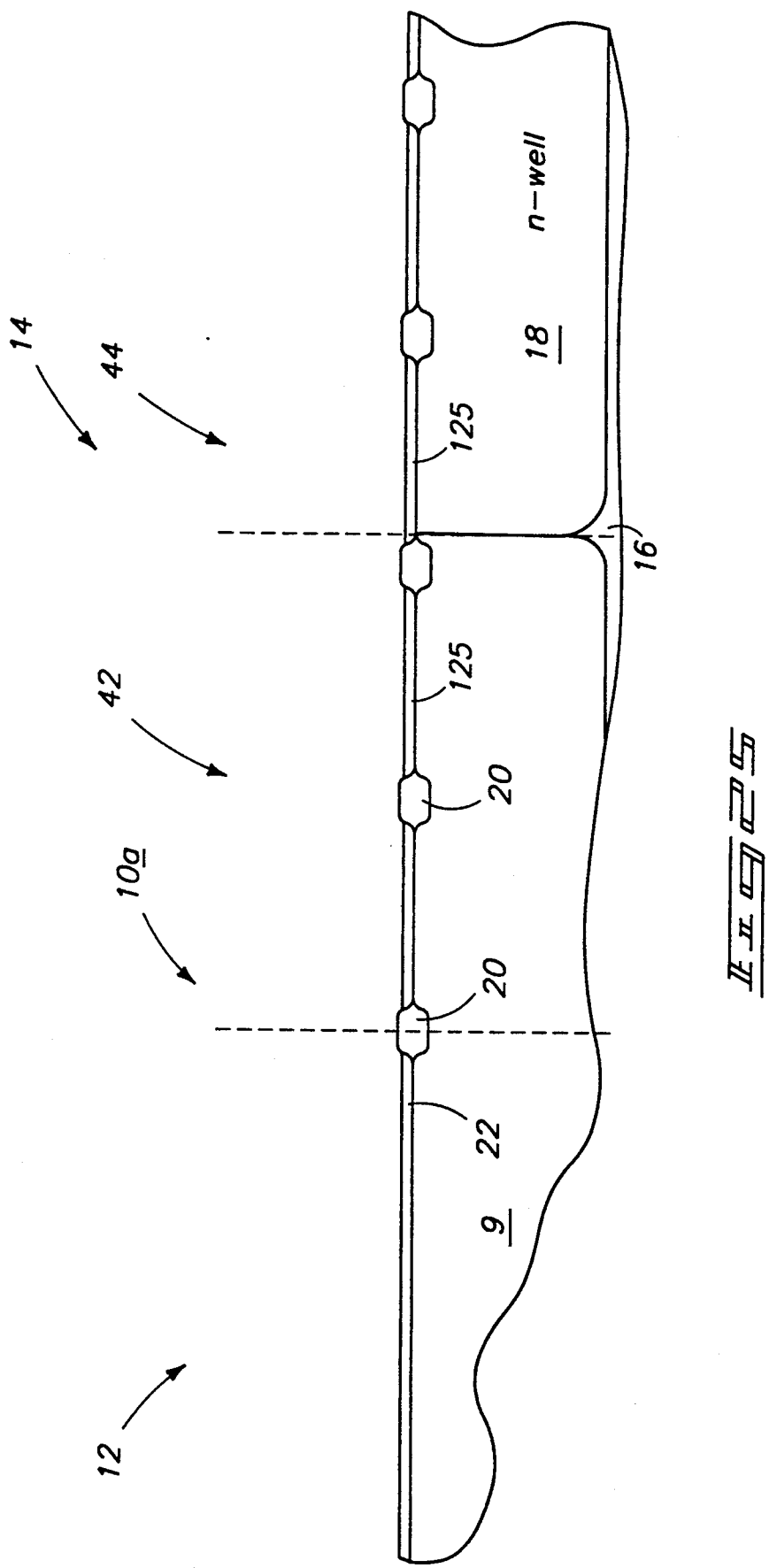
FIG. 25 is a reduced scale view of the FIG. 23 wafer, with the P-well and gate oxide layer step having been removed for clarity, and taken at a processing step subsequent to that illustrated by FIGS. 4A and 4B of the first described prior art process.

FIGS. 25-32 are reduced scale illustrations of wafer 10a at processing steps subsequent to that illustrated by FIGS. 16-24. Referring first to FIG. 25, array area 12 is defined for formation of first conductivity type nonvolatile memory devices in the array, with first and second conductivity type CMOS transistors to be formed in peripheral area 14. For purposes of the continuing discussion, the first and second conductivity type CMOS transistors will be formed in first and second peripheral areas 42, 44, respectively. Accordingly, peripheral area 14 can be considered as being divided into first and second peripheral areas 42 and 44.

Figure 26:
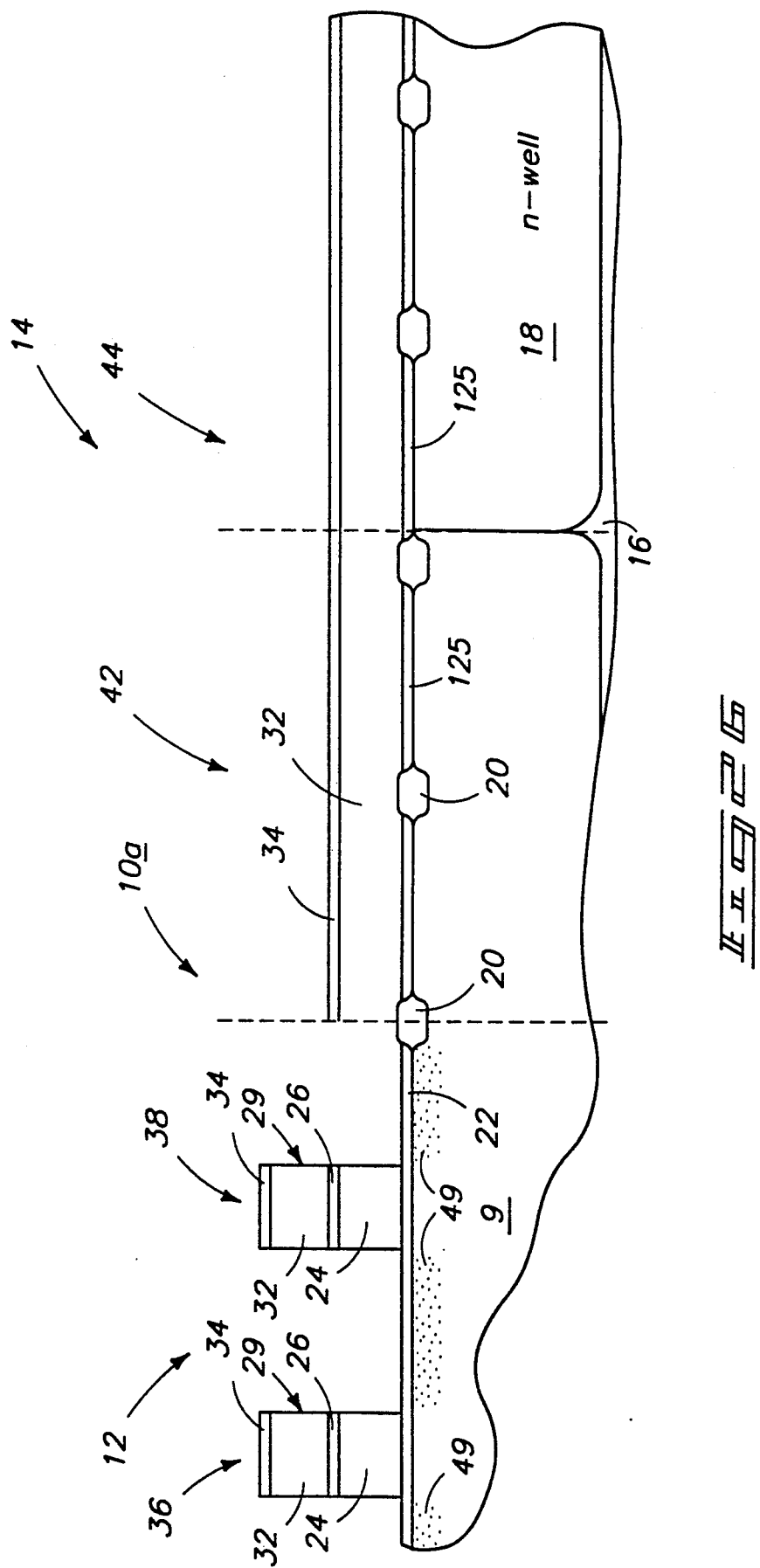
FIG. 26 is a cross sectional view of the FIG. 25 wafer at a processing step subsequent to that illustrated by FIG. 25.

Referring to FIG. 26, layers of polysilicon 24, 32, ONO 26, and silicide 34 are provided and patterned as shown. With the array 12 having been patterned and etched, with polysilicon and $WSi_x$ layers 32 and 34 respectively covering peripheral area 14, an optional punch-through or other first doping is conducted into exposed areas of the array adjacent gate regions 36 and 38. Such produces halo regions 49 as shown. An example punch-through dopant would be boron implanted at a dose of $5 \times 10^{12}$ atoms/cm$^2$. During such doping, the second layer of conductive poly 32 in peripheral area 14 masks peripheral area 14 from implantation. $WSi_x$ layer 34 and poly layer 32 provide an effective mask of peripheral area 14 during such first doping, without requiring any use of photoresist. However, the halo implant 49 could be conducted before removing the mask used to product lines 36 and 38 while covering area 14. Note that the array area n-channel transistor implants at this point can or are optimized relative to what will be peripheral area n-channel transistors as a result of layers 34 and 32 masking peripheral area 14.

Figure 27:
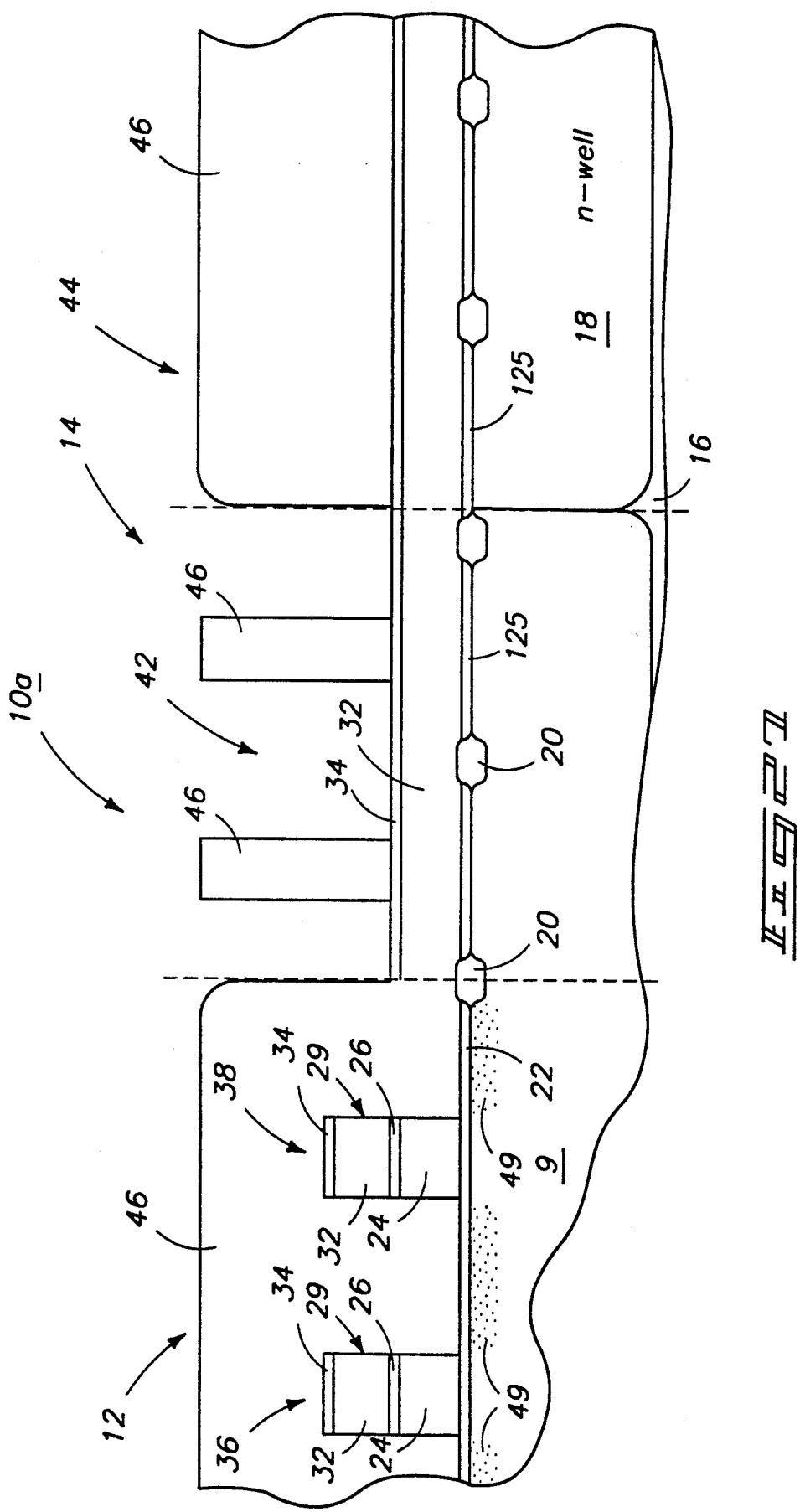
FIG. 27 is a cross sectional view of the FIG. 25 wafer at a processing step subsequent to that illustrated by FIG. 26.

Referring to FIG. 27, a layer of photoresist 46 is applied and patterned as shown to cover array 12 and second peripheral area 44, while defining regions for formation of MOS transistors within first peripheral area 42.

Figure 28:
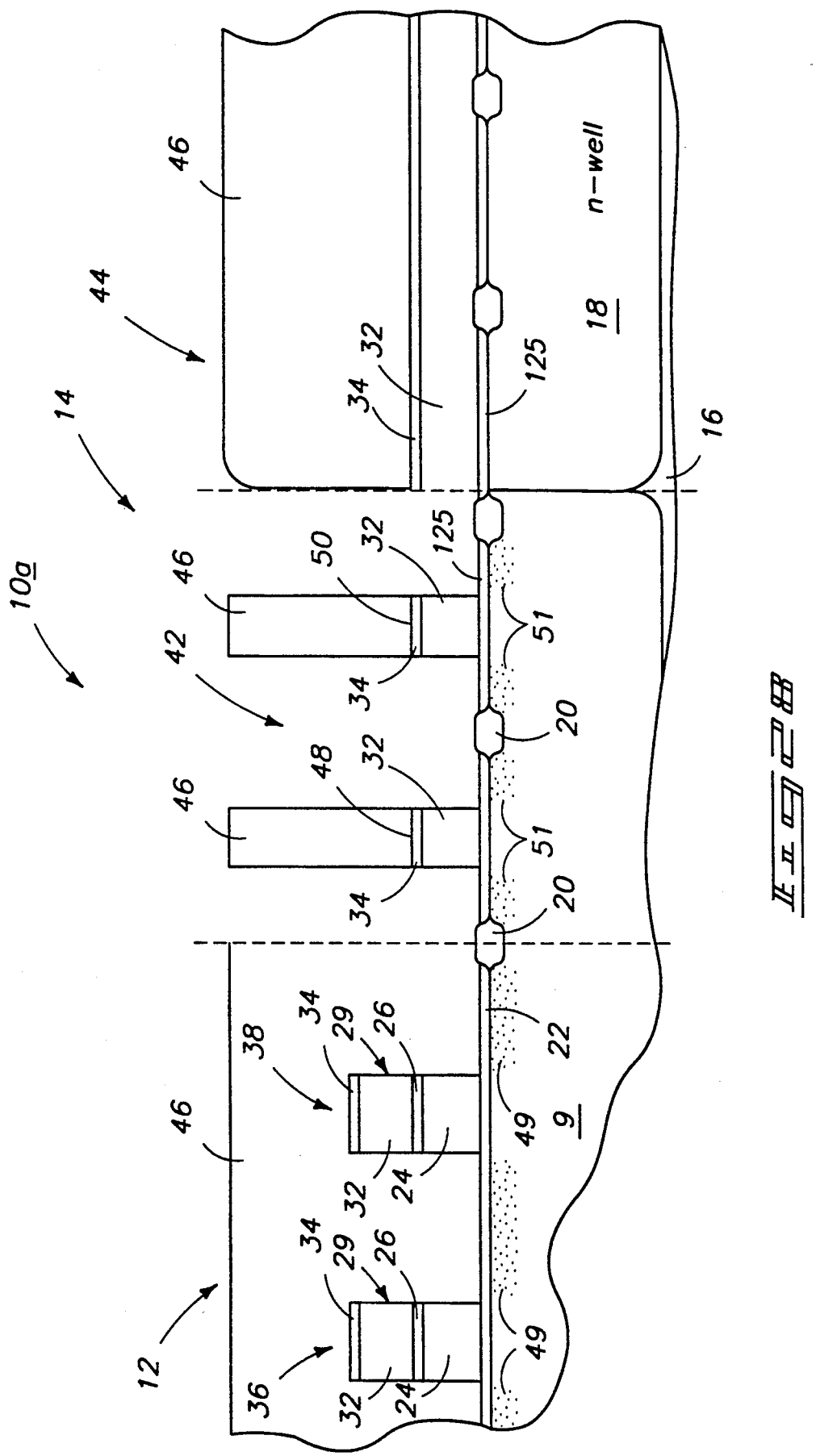
FIG. 28 is a cross sectional view of the FIG. 25 wafer at a processing step subsequent to that illustrated by FIG. 27.

Referring to FIG. 28, the wafer is etched to form desired transistor gates 48, 50 in first peripheral area 42. Note that the peripheral area n-well transistors are not patterned and etched at this time, unlike the prior art. At this point, an optional punch-through or other doping can be conducted to produce halo or other regions 51 as shown. Polysilicon 32 and $WSi_x$ 34 in second peripheral area 44 mask the second peripheral area from such implantation along with overlying photoresist 46. Likewise, photoresist 46 masks array area 12. Note that the implant to produce regions 51 can be conducted independent of whether regions 49 are produced, and independent of the region 49 implant dosage.

Figure 29:
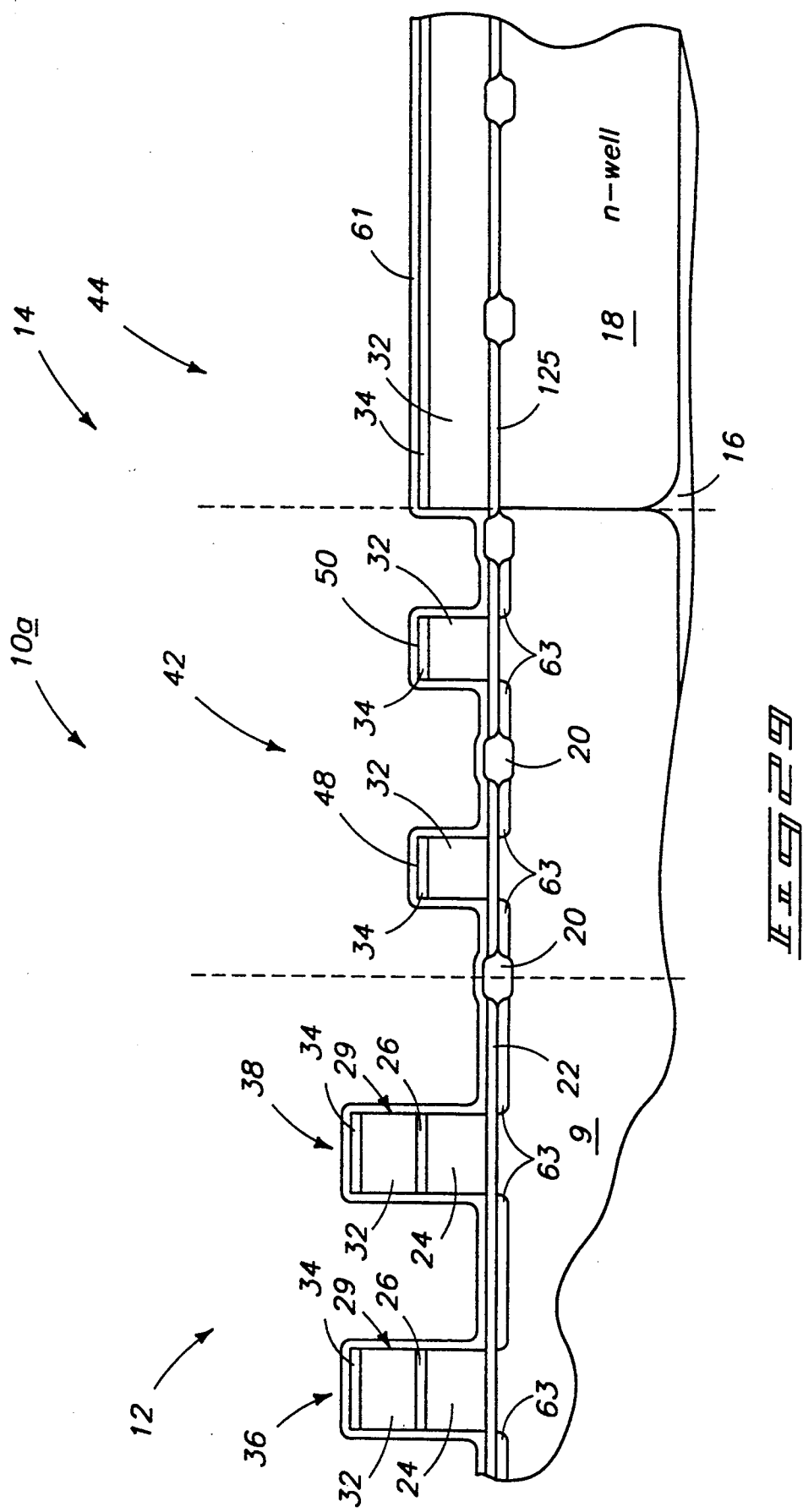
FIG. 29 is a cross sectional view of the FIG. 25 wafer at a processing step subsequent to that illustrated by FIG. 28.

Referring to FIG. 29, photoresist 46 has been removed and a thin 1000 Angstrom layer 61 of TEOS is applied to enable separation of a previously implanted boron halo and phosphorus to be implanted. The thickness of layer 61 in the figures is exaggerated for clarity. At this point, a first common doping of exposed areas of array 12 and first peripheral area 42 is conducted while second conductive layer 32 material masks second peripheral area 44 without the use of photoresist. The first common doping is conducted to form what will be LDD regions 63. A typical dose would be phosphorus at $5 \times 10^{13}$ atoms/cm$^2$. Regions 49 and 51 are no longer shown in FIG. 29 and subsequent figures for clarity.

Figure 30:
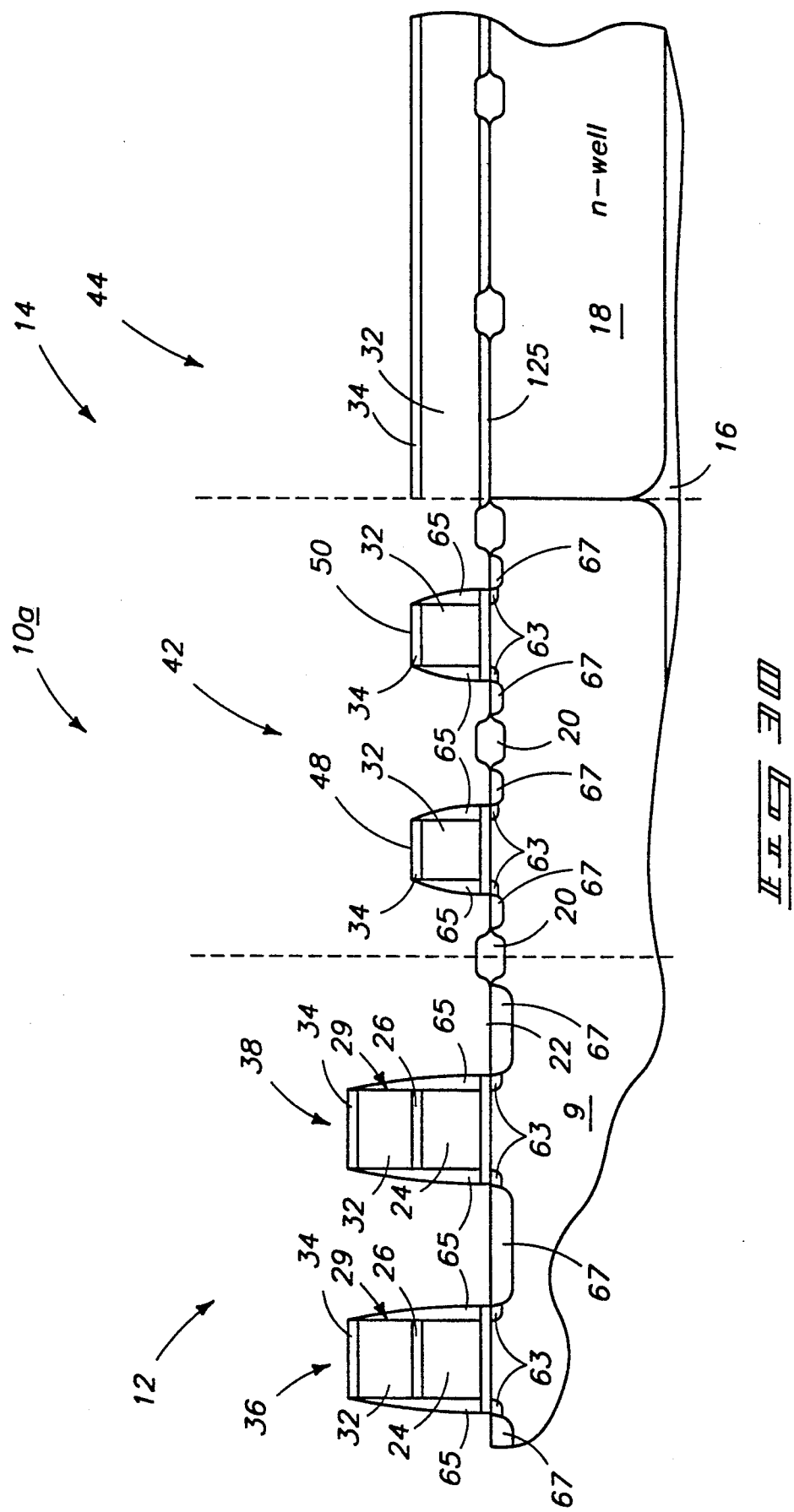
FIG. 30 is a cross sectional view of the FIG. 25 wafer at a processing step subsequent to that illustrated by FIG. 29.

Referring to FIG. 30, a layer of oxide is applied and anisotropically etched to form spacers 65 in combination with remaining material 61. Spacers 65 have a width at their base of approximately 2000 Angstroms to 4000 Angstroms. Layer 61 is not shown in FIG. 30 and subsequent figures for clarity. Thereafter, a heavy second common doping is conducted to form source and drain n+ regions 67 as shown. A typical dosage would be arsenic at $5 \times 10^{15}$ atoms/cm$^2$.

Referring to FIG. 31, a layer 52 of photoresist is applied, patterned and etched as indicated to form second peripheral area transistors gates 54, 56 for second conductivity type CMOS transistors within n-well 18. The etch is conducted to produce a slight overhang of photoresist 52 relative to gates 54 and 56. With photoresist mask 52 in place, second conductivity type (p-type) implants (typically boron) are performed into n-well 18 to create p-channel active areas 53. The overhang spaces the implanted boron a desired distance from the gate. An example dosage would be boron at $5 \times 10^{15}$ atoms/cm$^2$. Photoresist layer 52 masks array 12 and first peripheral area 42 during such doping.

Referring to FIG. 32, a silicon dioxide layer 304 is deposited and patterned to define a series of contact openings 305a, 305b, 305c, 305d, 305e, 305f, 305g, 305h, 305i and 305j to desired active areas. A TiN barrier/glue layer 313 is deposited and etched back to line contact openings 305a-305j, as shown. Subsequently, a contact filling layer 315 of tungsten is deposited and etched back to fill contact openings 305a-305j. Then, a metal layer such as an Al-Cu alloy is deposited and patterned to define respective interconnecting metal runners of lines 315a, 315b, 315c, 315d, 315e, 315f, 315g, 315h, 315i and 315j.

The described invention comprises a significant improvement over the prior art as such a CMOS process is now simplified and enables optimization of implants without additional process complexity. For example, the prior art requires six photomask steps as described above in the background. However in accordance with the above preferred embodiment from FIG. 25, the number of photomasks has been reduced to three (that which produces FIGS. 26, followed by FIG. 27 and FIG. 31, exclusive to the metallization masking), and as well the n-channel implants of the array and periphery can be optimized relative to one another. With the prior art, optimization of such regions would require another photomask step, bringing the total to seven.

Memory cells of the array preferably comprise EPROM or EEPROM cells.

The above described preferred embodiment proceeded with the separate patterning of each of array region 12, first peripheral area 42, and second peripheral area 44 separately, with the array area being patterned and etched first, the first peripheral area 42 being patterned and etched second, and second peripheral area 44 being patterned and etched last. The sequencing with respect to such separate patterning and etching could of course be changed without departing from the principles and scope of the invention. For example, second peripheral area 44 could be masked and etched first, followed by the separate patterning and etching of first peripheral area 42, and finally array 12. Any ordering of the three regions could be separately patterned and etched in accordance with the invention, with patterning and etching of the array with the detailed described steps above being preferred. Regardless of the order, it is preferred that the array 12 and first peripheral area 42 be patterned in sequence, as the transistors to be formed utilize the same conductivity type impurity. This enables the alternate doping step of such regions, as described above, which dopes such regions with first conductivity type impurity during the same step.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

We claim:

1. A process for fabricating a semiconductor wafer to form a memory array and peripheral area, the array comprising nonvolatile memory devices employing floating gate transistors of a first conductivity type, the peripheral area comprising first and second conductivity type CMOS transistors, the method comprising the following steps:

providing field and gate insulating layers on a semiconductor wafer, and defining an array area and an area peripheral to the array area for formation of first conductivity type nonvolatile memory devices in the array and formation of first and second conductivity type CMOS transistors in the peripheral area, the peripheral area comprising first and second peripheral areas, the first and second conductivity type CMOS transistors to be formed in the first and second peripheral areas respectively, such providing and defining comprising N-well and P-well formation, such formation comprising: a) oxidizing the wafer to create a first silicon dioxide layer thereon; b) subjecting the wafer to a blanket P-well implant; c) masking future P-well regions with photoresist; d) etching away those portions of the first silicon dioxide layer that are not subjacent photoresist; e) recessing those portions of the substrate that are not subjacent photoresist; f) subjecting the wafer to an N-well implant; g) stripping photoresist; and h) subjecting the wafer to a high-temperature substrate drive step to drive atoms of the P-well implant and atoms of the N-well implant to diffuse deeper into the substrate;

providing a first layer of conductive material atop the insulating layers;

providing a dielectric layer atop the first conductive layer for use in floating gate transistors within the array;

etching the dielectric layer and first conductive material from the peripheral area, and leaving dielectric layer and first conductive material in the array;

after etching the dielectric layer and first conductive material from the peripheral area, providing a second layer of conductive material atop the wafer which covers the peripheral area and dielectric layer of the array;

patterning and etching the first conductive, second conductive and dielectric layers of the array and second conductive layer of the peripheral area to form gate regions of floating gate transistors in the array, and to cover the peripheral area;

patterning and etching the second conductive layer in the peripheral area to form transistor gates for the first conductivity type CMOS transistors in the first peripheral area, and to cover the second peripheral area;

after patterning and etching the array to form floating gate transistors and after patterning and etching the peripheral area to form transistor gates for the first conductivity type CMOS transistors, first doping exposed areas of only one of the array or first peripheral area while the second peripheral area and other of the array or first peripheral area are masked;

after the first doping, masking the second peripheral area with the second conductive layer without the use of photoresist and common doping exposed areas of the array and first peripheral area with first conductivity type material in the same step;

after patterning the array and first peripheral area, patterning and etching the second conductive layer in the second peripheral area to form transistor gates for the second conductivity type CMOS transistors in the second peripheral area; and after patterning and etching the second peripheral area, doping exposed areas of the second peripheral area with second conductivity type material while the array and first peripheral area are masked.

2. The process for fabricating a semiconductor wafer of claim 1 comprising patterning and etching the array to form the floating gate transistors before patterning and etching the first peripheral area to form the first conductivity type CMOS transistors, and wherein the first doping is conducted into exposed areas of the array.

3. The process for fabricating a semiconductor wafer of claim 1 comprising patterning and etching the first peripheral area to form the first conductivity type CMOS transistors before patterning and etching the array to form the floating gate transistors, and wherein the first doping is conducted into exposed areas of the first peripheral area.

4. The process for fabricating a semiconductor wafer of claim 1 wherein the recited conductive material is everywhere conductively doped polysilicon.

5. The process for fabricating a semiconductor wafer of claim 1 wherein the first conductivity type is "n" and the second conductivity type is "p".

6. The process for fabricating a semiconductor wafer of claim 1 wherein the recited conductive material is everywhere conductively doped polysilicon, and wherein the first conductivity type is "n" and the second conductivity type is "p".

7. The process for fabricating a semiconductor wafer of claim 1 further comprising conducting a second common doping of exposed areas of the array and first peripheral area with first conductivity type material in the same step while the second peripheral area is masked without the use of photoresist.

8. A process for fabricating a semiconductor wafer to form a memory array and peripheral area, the array comprising nonvolatile memory devices employing floating gate transistors of a first conductivity type, the peripheral area comprising first and second conductivity type CMOS transistors, the method comprising the following steps:

providing field and gate insulating layers on a semiconductor wafer, and defining an array area and an area peripheral to the array area for formation of first conductivity type nonvolatile memory devices in the array and formation of first and second conductivity type CMOS transistors in the peripheral area, the peripheral area comprising first and second peripheral areas, the first and second conductivity type CMOS transistors to be formed in the first and second peripheral areas respectively, such providing and defining comprising N-well and P-well formation, such formation comprising: a) oxidizing the wafer to create a first silicon dioxide layer thereon; b) subjecting the wafer to a blanket P-well implant; c) masking future P-well regions with photoresist; d) etching away those portions of the first silicon dioxide layer that are not subjacent photoresist; e) recessing those portions of the substrate that are not subjacent photoresist; f) subjecting the wafer to an N-well implant; g) stripping photoresist; and h) subjecting the wafer to a high-temperature substrate drive step to drive atoms of the P-well implant and atoms of the N-well implant to diffuse deeper into the substrate;

providing a first layer of conductive material atop the insulating layers;

providing a dielectric layer atop the first conductive layer for use in floating gate transistors within the array;

etching the dielectric layer and first conductive material from the peripheral area, and leaving dielectric layer and first conductive material in the array;

after etching the dielectric layer and first conductive material from the peripheral area, providing a second layer of conductive material atop the wafer which covers the peripheral area and dielectric layer of the array;

patterning and etching the first conductive, second conductive and dielectric layers of the array and second conductive layer of the peripheral area to form transistor gates for the peripheral second conductivity type CMOS transistors, and to cover the array and first peripheral area;

first doping exposed areas of the second peripheral area with second conductivity type material, the second layer of conductive material in the array and first peripheral area masking the array and first peripheral area from implantation during the first doping;

after doping the second peripheral area, patterning and etching the second conductive layer in the peripheral area to form transistor gates for the first conductivity type CMOS transistors in the first peripheral area, and to cover the array;

after doping the second peripheral area, patterning and etching the first conductive, second conductive and dielectric layers of the array to form gate regions of floating transistors;

after doping the second peripheral area and after patterning and etching only one of the array or first peripheral area, second doping exposed areas of the one of the array or first peripheral area with first conductivity type material while the second peripheral area and other of the array or first peripheral area are masked, the other of the array or first peripheral area being masked by unpatterned second conductive layer without the use of photoresist during such second doping; and after the first and second dopings, common doping exposed areas of the array and first peripheral area with first conductivity type material in the same step while the second peripheral area is masked.

9. The process for fabricating a semiconductor wafer of claim 8 comprising patterning and etching the array to form the floating gate transistors before patterning and etching the first peripheral area to form the first conductivity type CMOS transistors, and wherein the first doping is conducted into exposed areas of the array.

10. The process for fabricating a semiconductor wafer of claim 8 comprising patterning and etching the first peripheral area to form the first conductivity type CMOS transistors before patterning and etching the array to form the floating gate transistors, and wherein the first doping is conducted into exposed areas of the first peripheral area.

11. The process for fabricating a semiconductor wafer of claim 8 wherein the recited conductive material is everywhere conductively doped polysilicon.

12. The process for fabricating a semiconductor wafer of claim 8 wherein the first conductivity type is "n" and the second conductivity type is "p".

13. The process for fabricating a semiconductor wafer of claim 8 wherein the recited conductive material is everywhere conductively doped polysilicon, and wherein the first conductivity type is "n" and the second conductivity type is "p".

14. The process of fabricating a semiconductor wafer of claim 8 further comprising conducting a second common doping of exposed areas of the array and first peripheral area with first conductivity type material in the same step while the second peripheral area is masked without the use of photoresist.

15. A process for fabricating a semiconductor wafer to form a memory array and peripheral area, the array comprising nonvolatile memory devices employing floating gate transistors of a first conductivity type, the peripheral area comprising first and second conductivity type CMOS transistors, the method comprising the following steps:

providing field and gate insulating layers on a semiconductor wafer, and defining an array area and an area peripheral to the array area for formation of first conductivity type nonvolatile memory devices in the array and formation of first and second conductivity type CMOS transistors in the peripheral area, the peripheral area comprising first and second peripheral areas, the first and second conductivity type CMOS transistors to be formed in the first and second peripheral areas respectively, such providing and defining comprising N-well and P-well formation, such formation comprising: a) oxidizing the wafer to create a first silicon dioxide layer thereon; b) subjecting the wafer to a blanket P-well implant; c) masking future P-well regions with photoresist; d) etching away those portions of the first silicon dioxide layer that are not subjacent photoresist; e) recessing those portions of the substrate that are not subjacent photoresist; f) subjecting the wafer to an N-well implant; g) stripping photoresist; and h) subjecting the wafer to a high-temperature substrate drive step to drive atoms of the P-well implant and atoms of the N-well implant to diffuse deeper into the substrate;

providing a first layer of conductive material atop the insulating layers;

providing a dielectric layer atop the first conductive layer for use in floating gate transistors within the array;

etching the dielectric layer and first conductive material from the peripheral area, and leaving dielectric layer and first conductive material in the array;

after etching the dielectric layer and first conductive material from the peripheral area, providing a second layer of conductive material atop the wafer which covers the peripheral area and dielectric layer of the array;

patterning and etching the first conductive, second conductive and dielectric layers of the array and second conductive layer of the peripheral area to form gate regions of floating gate transistors in the array, and to cover the peripheral area;

patterning and etching the second conductive layer in the peripheral area to form transistor gates for the first conductivity type CMOS transistors in the first peripheral area, and to cover the second peripheral area;

after patterning and etching the array to form floating gate transistors and after patterning and etching the peripheral area to form transistor gates for the first conductivity type CMOS transistors, masking the second peripheral area with the second conductive layer without the use of photoresist and common doping exposed areas of the array and first peripheral area with first conductivity type material in the same step;

after patterning the array and first peripheral area, patterning and etching the second conductive layer in the second peripheral area to form transistor gates for the second conductivity type CMOS transistors in the second peripheral area; and after patterning and etching the second peripheral area, doping exposed areas of the second peripheral area with second conductivity type material while the array and first peripheral area are masked.

16. The process for fabricating a semiconductor wafer of claim 15 comprising patterning and etching the array to form the floating gate transistors before patterning and etching the first peripheral area to form the first conductivity type CMOS transistors.

17. The process for fabricating a semiconductor wafer of claim 15 comprising patterning and etching the first peripheral area to form the first conductivity type CMOS transistors before patterning and etching the array to form the floating gate transistors.

18. The process for fabricating a semiconductor wafer of claim 15 wherein the recited conductive material is everywhere conductively doped polysilicon.

19. The process for fabricating a semiconductor wafer of claim 15 wherein the first conductivity type is "n" and the second conductivity type is "p".

20. The process for fabricating a semiconductor wafer of claim 15 wherein the recited conductive material is everywhere conductively doped polysilicon, and wherein the first conductivity type is "n" and the second conductivity type is "p".

21. The process for fabricating a semiconductor wafer of claim 15 further comprising conducting a second common doping of exposed areas of the array and first peripheral area with first conductivity type material in the same step while the second peripheral area is masked without the use of photoresist.

22. A process for fabricating a semiconductor wafer to form a memory array and peripheral area, the array comprising nonvolatile memory devices employing floating gate transistors of a first conductivity type, the peripheral area comprising first and second conductivity type CMOS transistors, the method comprising the following steps:

providing field and gate insulating layers on a semiconductor wafer, and defining an array area and an area peripheral to the array area for formation of first conductivity type nonvolatile memory devices in the array and formation of first and second conductivity type CMOS transistors in the peripheral area, the peripheral area comprising first and second peripheral areas, the first and second conductivity type CMOS transistors to be formed in the first and second peripheral areas respectively, such providing and defining comprising N-well and P-well formation, such formation comprising: a) oxidizing the wafer to create a first silicon dioxide layer thereon; b) subjecting the wafer to a blanket P-well implant; c) masking future P-well regions with photoresist; d) etching away those portions of the first silicon dioxide layer that are not subjacent photoresist; e) recessing those portions of the substrate that are not subjacent photoresist; f) subjecting the wafer to an N-well implant; g) stripping photoresist; and h) subjecting the wafer to a high-temperature substrate drive step to drive atoms of the P-well implant and atoms of the N-well implant to diffuse deeper into the substrate;

providing a first layer of conductive material atop the insulating layers;

providing a dielectric layer atop the first conductive layer for use in floating gate transistors within the array;

etching the dielectric layer and first conductive material from the peripheral area, and leaving dielectric layer and first conductive material in the array;

after etching the dielectric layer and first conductive material from the peripheral area, providing a second layer of conductive material atop the wafer which covers the peripheral area and dielectric layer of the array;

patterning and etching the first conductive, second conductive and dielectric layers of the array and second conductive layer of the peripheral area to form transistor gates for the peripheral second conductivity type CMOS transistors, and to cover the array and first peripheral area;

doping exposed areas of the second peripheral area with second conductivity type material, the second layer of conductive material in the array and first peripheral area masking the array and first peripheral area from implantation during the doping;

after doping the second peripheral area, patterning and etching the second conductive layer in the peripheral area to form transistor gates for the first conductivity type CMOS transistors in the first peripheral area, and to cover the array;

after doping the second peripheral area, patterning and etching the first conductive, second conductive and dielectric layers of the array to form gate regions of floating transistors; and common doping exposed areas of the array and first peripheral area with first conductivity type material in the same step while the second peripheral area is masked.

23. The process for fabricating a semiconductor wafer of claim 22 comprising patterning and etching the array to form the floating gate transistors before patterning and etching the first peripheral area to form the first conductivity type CMOS transistors.

24. The process for fabricating a semiconductor wafer of claim 22 comprising patterning and etching the first peripheral area to form the first conductivity type CMOS transistors before patterning and etching the array to form the floating gate transistors.

25. The process for fabricating a semiconductor wafer of claim 22 wherein the recited conductive material is everywhere conductively doped polysilicon.

26. The process for fabricating a semiconductor wafer of claim 22 wherein the first conductivity type is "n" and the second conductivity type is "p".

27. The process for fabricating a semiconductor wafer of claim 22 wherein the recited conductive material is everywhere conductively doped polysilicon, and wherein the first conductivity type is "n" and the second conductivity type is "p".

28. The process for fabricating a semiconductor wafer of claim 22 further comprising conducting a second common doping of exposed areas of the array and first peripheral area with first conductivity type material in the same step while the second peripheral area is masked without the use of photoresist.

* * * * *